(12) United States Patent
Wang

(10) Patent No.: US 11,429,216 B2
(45) Date of Patent: Aug. 30, 2022

(54) CONTROL CIRCUIT AND DISPLAY APPARATUS UTILIZING THE SAME

(71) Applicant: Nuvoton Technology Corporation, Hsinchu (TW)

(72) Inventor: Cheng-Chih Wang, Jhubei (TW)

(73) Assignee: NUVOTON TECHNOLOGY CORPORATION, Hsinchu Science Park (TW)

(*) Notice: Subject to any disclaimer, the term of this patent is extended or adjusted under 35 U.S.C. 154(b) by 0 days.

(21) Appl. No.: 17/200,326

(22) Filed: Mar. 12, 2021

(65) Prior Publication Data

US 2021/0200368 A1 Jul. 1, 2021

Related U.S. Application Data

(63) Continuation-in-part of application No. 16/728,667, filed on Dec. 27, 2019, now Pat. No. 10,976,874.

(30) Foreign Application Priority Data

Oct. 25, 2019 (TW) .................................. 108138533

(51) Int. Cl.
*G06F 3/045* (2006.01)
*G06F 3/041* (2006.01)
(Continued)

(52) U.S. Cl.
CPC ............ *G06F 3/0412* (2013.01); *G06F 3/044* (2013.01); *G06F 3/04166* (2019.05);
(Continued)

(58) Field of Classification Search
CPC .................. H02M 1/08; H02M 1/088; H02M 2001/0009; H02M 2001/0045; H02M 2001/0048; H02M 3/158
See application file for complete search history.

(56) References Cited

U.S. PATENT DOCUMENTS

2017/0192563 A1* 7/2017 Liao ...................... G06F 3/0443
2018/0284928 A1* 10/2018 Kremin ............... G06F 3/04166

FOREIGN PATENT DOCUMENTS

CN 104981908 B 11/2017
CN 107957809 A 4/2018
(Continued)

OTHER PUBLICATIONS

U.S. Appl. No. 17/200,360, filed Mar. 12, 2021.
(Continued)

*Primary Examiner* — Insa Sadio
(74) *Attorney, Agent, or Firm* — Muncy, Geissler, Olds & Lowe, P.C.

(57) ABSTRACT

A control circuit including a first input-output pin, a second input-output pin, a sensing circuit and a display controller is provided. The first input-output pin is configured to be coupled to a first input pin of a display device and a first sensing pin of a capacitive touch device. The second input-output pin is configured to be coupled to a second input pin of the display device and a second sensing pin of the capacitive touch device. The display controller provides a first driving signal to the display device via the first input-output pin and providing a second driving signal to the display device via the second input-output pin in a display period. In a first sensing period, the voltage level of the first input-output pin is equal to a first predetermined level, and the sensing circuit detects the voltage of the second input-output pin.

20 Claims, 14 Drawing Sheets

(51) Int. Cl.
*G06F 3/044* (2006.01)
*H01L 27/32* (2006.01)
*G09G 3/3216* (2016.01)

(52) U.S. Cl.
CPC ......... *G09G 3/3216* (2013.01); *H01L 27/323* (2013.01); *H01L 27/3281* (2013.01); *G09G 2310/067* (2013.01); *G09G 2354/00* (2013.01)

(56) References Cited

FOREIGN PATENT DOCUMENTS

| CN | 107957809 A | 4/2018 |
| TW | 201809989 A | 3/2018 |
| TW | 201809989 A | 3/2018 |

OTHER PUBLICATIONS

Office Action dated Jan. 24, 2022 in TW Application No. 110114632, 6 pages.
Office Action issued in corresponding TW application No. 108138533 dated May 20, 2020 (with Search Report attached thereto) (6 pages).

* cited by examiner

US 11,429,216 B2

CONTROL CIRCUIT AND DISPLAY APPARATUS UTILIZING THE SAME

CROSS REFERENCE TO RELATED APPLICATIONS

This application is a Continuation-In-Part of pending U.S. patent application Ser. No. 16/728,667, filed Dec. 27, 2019 and entitled "control circuit and operating system utilizing the same", and priority of Taiwan Patent Application No. 108138533, filed on Oct. 25, 2019, which are hereby incorporated by reference in their entirety.

BACKGROUND OF THE INVENTION

Field of the Invention

The invention relates to a control circuit, and more particularly to a control circuit that is coupled to a display device and a touch device.

Description of the Related Art

With technological development, the types and functions of electronic devices have increased. Generally, each electronic device has at least one input device and at least one output device. A control device in a corresponding electronic device controls the operation of the electronic device according to the information received by the input device. The control device displays the corresponding image via the output device. The touch device is a common input device. The display device is a common output device. However, since the touch device and the display device have more input-output pins, the number of pins in the control device must be greater than the sum of the number of input-output pins in the touch device and the display device so that the control device can be coupled to the touch device and the display device. Therefore, the space in the electronic device is reduced.

BRIEF SUMMARY OF THE INVENTION

In accordance with an embodiment, a control circuit comprises a first input-output pin, a second input-output pin, a sensing circuit and a display controller. The first input-output pin is configured to be coupled to a first input pin of a display device and a first sensing pin of a capacitive touch device. The second input-output pin is configured to be coupled to a second input pin of the display device and a second sensing pin of the capacitive touch device. The sensing circuit determines whether the capacitive touch device is touched according to the voltage of the first input-output pin and the voltage of the second input-output pin. The display controller provides a first driving signal to the display device via the first input-output pin and providing a second driving signal to the display device via the second input-output pin in a display period. In a first sensing period, the voltage level of the first input-output pin is equal to a first predetermined level, and the sensing circuit detects the voltage of the second input-output pin.

In accordance with another embodiment, a display apparatus comprises a display device, a capacitive touch device, and a control circuit. The display device comprises a first input pin and a second input pin. The capacitive touch device comprises a first sensing pin and a second sensing pin. The control circuit comprises a first input-output pin, a second input-output pin, a sensing circuit, and a display controller. The first input-output pin is configured to be coupled to the first input pin and the first sensing pin. The second input-output pin is configured to be coupled to the second input pin and the second sensing pin. The sensing circuit determines whether the capacitive touch device is touched according to the voltage of the first input-output pin and the voltage of the second input-output pin. The display controller provides a first driving signal to the display device via the first input-output pin and providing a second driving signal to the display device via the second input-output pin in a display period. In a first sensing period, the sensing circuit sets the voltage level of the first input-output pin to a first predetermined level and detects the voltage of the second input-output pin.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
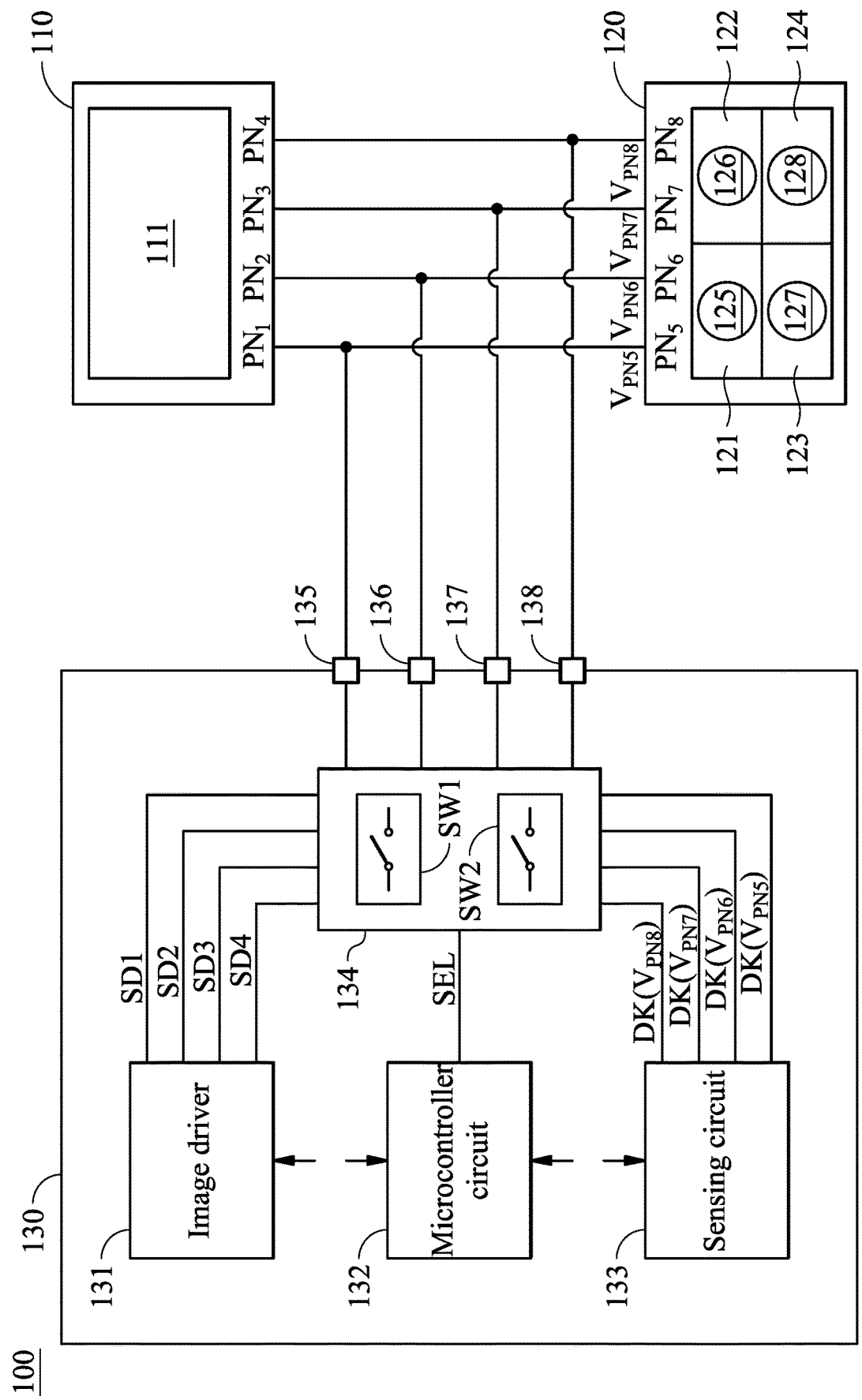
FIG. 1 is a schematic diagram of an exemplary embodiment of an operating system, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an operating system, according to various aspects of the present disclosure. As shown in FIG. 1, the operating system 100 comprises a display device 110, a capacitive touch device 120 and a control circuit 130. The display device 110 comprises pins $PN_1$~$PN_4$ and a display area 111. The display area 111 displays an image according to the voltage levels of the pins $PN_1$~$PN_4$. The number of pins of the display device 110 is not limited in the present disclosure. Additionally, the invention is not limited to the kind of display device 110. In one embodiment, the display device 110 is a super twisted liquid-crystal display (STN LCD) panel.

The capacitive touch device 120 comprises areas 121~124, sensing elements 125~128 and pins $PN_5$~$PN_8$, but the disclosure is not limited thereto. In other embodiment, the capacitive touch device 120 may comprise more or fewer areas, sensing elements and pins. The invention is not limited to the kind of capacitive touch device 120. In one embodiment, the capacitive touch device 120 is a touch keyboard or a touch pad.

In this embodiment, the sensing element 125 is disposed in the area 121 to determine whether the area 121 is touched, the sensing element 126 is disposed in the area 122 to determine whether the area 122 is touched, the sensing element 126 is disposed in the area 123 to determine whether the area 123 is touched, and the sensing element 128 is disposed in the area 124 to determine whether the area 124 is touched. In one embodiment, the sensing elements 125~128 are capacitive sensors. The pin $PN_5$ outputs the sensing result generated by the sensing element 125. The pin $PN_6$ outputs the sensing result generated by the sensing element 126. The pin $PN_7$ outputs the sensing result generated by the sensing element 127. The pin $PN_8$ outputs the sensing result generated by the sensing element 128. Taking the sensing element 125 as an example, when the area 121 is not touched, the capacitance of the sensing element 125 is not changed. Therefore, the voltage $V_{PN5}$ of the pin $PN_5$ is equal to a reference voltage. However, when the area 121 is touched, the capacitance of the sensing element 125 is changed (e.g., increase). Therefore, voltage $V_{PN5}$ of the pin $PN_5$ is not equal to the reference voltage, for example, the voltage $V_{PN5}$ of the pin $PN_5$ may be less than the reference voltage.

The control circuit 130 comprises an image driver 131, a microcontroller circuit 132, a sensing circuit 133, a transmission circuit 134 and an input-output pins 135~138. The image driver 131 is configured to drive the display device 110. In this embodiment, the image driver 131 generates driving signals SD1~SD4, but the disclosure is not limited thereto. In other embodiments, the image driver 131 may generate more or fewer driving signals. The structure of the image driver 131 is not limited in the present disclosure. In one embodiment, the image driver 131 is a LCD driver. In another embodiment, the image driver 131 is a COM/SEG driver to generate COM/SEG wave.

The sensing circuit 133 is configured to determine whether the capacitive touch device 120 is touched and the touched position. The invention does not limit how the sensing circuit 133 determines whether the capacitive touch device 120 is touched. In one embodiment, the sensing circuit 133 first provides a reference voltage DK to the pins $PN_5$~$PN_8$ of the capacitive touch device 120 and then detects whether the voltage levels of the pins $PN_5$~$PN_8$ are changed. When one voltage level is changed, it means that the corresponding area is touched. For example, when the voltage $V_{PN5}$ of the pin $PN_5$ is not equal to the reference voltage DK, it means that the area 121 corresponding to the pin $PN_5$ is touched. On the contrary, when the voltage $V_{PN5}$ of the pin $PN_5$ is equal to the reference voltage DK, it means that the area 121 corresponding to the pin $PN_5$ is not touched. In other embodiments, the reference voltage DK is less than 1V.

The transmission circuit 134 comprises switching circuits SW1 and SW2. The switching circuit SW1 is coupled between the image driver 131 and the input-output pins 135~138 and controlled by a switching signal SEL. When the switching signal SEL turns on the switching circuit SW1, the switching circuit SW1 transmits the driving signals SD1~SD4 to the input-output pins 135~138. At this the input-output pins 135~138 serve as output pins to output the driving signals SD1~SD4 to the display device 110.

The switching circuit SW2 is coupled between the sensing circuit 133 and the input-output pins 135~138 and controlled by the switching signal SEL. When the switching signal SEL turns ort the switching circuit SW2, the switching circuit SW2 may transmit the reference voltage DK to the input-output pins 135~138 and then transmit the voltages $V_{PN5}$~$V_{PN8}$ of the pins $PN_5$~$PN_8$ to the sensing circuit 133.

In this embodiment, the input-output pins 135~138 are configured to transmit analog signals. In other words, the driving signals SD1~SD4 and the voltages $V_{PN5}$~$V_{PN8}$ are analog signals. Additionally, in the embodiment, the display device 110 and the capacitive touch device 120 share the input-output pins 135~138. Therefore, the number of input-output pins of the control circuit 130 can be reduced. In other embodiments, the display device 110 and the capacitive touch device 120 share more or fewer input-output pins.

Since the features of the input-output pins 135~138 are the same, the input-output pin 135 is given as an example. As shown in FIG. 1, the input-output pin 135 is coupled to the pin $PN_1$ of the display device 110 and the pin $PN_5$ of the capacitive touch device 120. When the switching circuit SW1 is turned on, the input-output pin 135 transmits the driving signal SD1. When the switching circuit SW2 is turned on, the input-output pin 135 transmits the reference voltage DK and the voltage $V_{PN5}$ of the pin $PN_5$.

In one embodiment, the voltages $V_{PN5}$~$V_{PN8}$ of the pins $PN_5$~$PN_8$ are one-third or one-quarter of the amplitudes of the driving signals SD1~SD4. Therefore, even if the pins $PN_5$~$PN_8$ are coupled to the pins $PN_1$~$PN_4$, the voltages $V_{PN5}$~$V_{PN8}$ of the pins $PN_5$~$PN_8$ do not affect the image displayed on the display device 110.

For example, assume that the peak voltage of each of the driving signals SD1~SD4 is 4V. In this case, the peak value of each of the voltages $V_{PN5}$~$V_{PN8}$ of the pins $PN_5$~$PN_8$ is about 1.3V (i.e., one-third of the peak voltage of each of the driving signals SD1~SD4) or about 1V (i.e., one-quarter of the peak voltage of the driving signal SD1. Since the voltages $V_{PN5}$~$V_{PN8}$ of the pins $PN_5$~$PN_8$ are small, the image displayed on the display device 110 does not be interfered by the voltages $V_{PN5}$~$V_{PN8}$ of the pins $PN_5$~$PN_8$. In other embodiments, the voltages $V_{PN5}$~$V_{PN8}$ of the pins $PN_5$~$PN_8$ are less than 1V.

The microcontroller circuit 132 generates the switching signal SEL to control the switching circuits SW1 and SW2. In this embodiment, the switching circuits SW1 and SW2 are not simultaneously turned on. For example, when the microcontroller circuit 132 turns on the switching circuit SW1, the microcontroller circuit 132 does not turn on the switching circuit SW2. When the microcontroller circuit 132 turns on the switching circuit SW2, the microcontroller circuit 132 does not turn on the switching circuit SW1.

The structure of microcontroller circuit 132 is not limited in the present disclosure. In one embodiment, the microcontroller circuit 132 is a microcontroller unit (MCU). In this embodiment, the microcontroller circuit 132 utilizes a single switching signal (e.g., SEL) to control the switching circuits SW1 and SW2, but the disclosure is not limited thereto. In other embodiments, the microcontroller circuit 132 utilizes two switching signals to control the switching circuits SW1 and SW2 respectively.

In other embodiments, the microcontroller circuit 132 further triggers the image driver 131 and the sensing circuit 133. When the image driver 131 is triggered, the image driver 131 generates the driving signals SD1~SD4. At this time, the microcontroller circuit 132 utilizes the switching signal SEL to turn on the switching circuit SW1 and turn off the switching circuit SW2. Therefore, the input-output pins 135~138 output the driving signals SD1~SD4 to the display device 110. The display device 110 displays an image according to the driving signals SD1~SD4.

When the microcontroller circuit 132 triggers the sensing circuit 133, the sensing circuit 133 generates the reference voltage DK. At this time, the microcontroller circuit 132 utilizes the switching signal SEL to turn on the switching circuit SW2 and turn off the switching circuit SW1. Therefore, the input-output pins 135~138 first output the reference voltage DK to the capacitive touch device 120 and then provide the voltages $V_{PN5}$~$V_{PN8}$ of the pins $PN_5$~$PN_8$ to the sensing circuit 133. In this case, the sensing circuit 133 determines whether any of the areas 121~124 is touched according to the voltages $V_{PN5}$~$V_{PN8}$ of the pins $PN_5$~$PN_8$.

In other embodiments, when the microcontroller circuit 132 triggers the sensing circuit 133, the microcontroller circuit 132 may direct the image driver 131 to stop generating the driving signals SD1~SD4. In some embodiments, the image driver 131 may still generate the driving signals SD1~SD4. However, since the microcontroller circuit 132 turns off the switching circuit SW1, the switching circuit SW1 does not transmit the driving signals SD1~SD4 to the input-output pins 135~138. In this case, since the display device 110 has charge storage elements, if the display device 110 does not receive the driving signals SD1~SD4, the display device 110 is capable of maintaining the image.

In this embodiment, the duration which the switching circuit SW2 is turned on is shorter than the duration which the switching circuit SW1 is turned on. For example, the duration which the switching circuit SW2 is turned on may be one tenth of the duration which the switching circuit SW1 is turned on. Therefore, even if the switching circuit SW1 briefly stops transmitting the driving signals SD1~SD4, the image displayed on the display device 110 does not be interfered by the voltages $V_{PN5}$~$V_{PN8}$ of the pins $PN_5$~$PN_8$. In one embodiment, the duration which the switching circuit SW1 is turned on is about 250 us, and the duration which the switching circuit SW2 is turned on is about 250 ns.

Additionally, since the voltages $V_{PN5}$~$V_{PN8}$ of the pins $PN_5$~$PN_8$ are small, even if the display device 110 receives the voltages $V_{PN5}$~$V_{PN8}$ of the pins $PN_5$~$PN_8$, the image displayed on the display device 110 does not be interfered by the voltages $V_{PN5}$~$V_{PN8}$ of the pins $PN_5$~$PN_8$. In one embodiment, the voltages $V_{PN5}$~$V_{PN8}$ of the pins $PN_5$~$PN_8$ may he lower than one-third of the driving signals SD1~SD4. In another embodiment, the voltages $V_{PN5}$~$V_{PN8}$ of the pins $PN_5$~$PN_8$ may be lower than one-quarter of the driving signals SD1~SD4. In other embodiments, the voltages $V_{PN5}$~$V_{PN8}$ of the pins $PN_5$~$PN_8$ are lower than 1V.

The invention does not limit when the microcontroller circuit 132 turns on the switching circuit SW2. Assume that the display device 110 displays many frames in 1 sec. In one embodiment, the microcontroller circuit 132 turns on the switching circuit SW2 between two frames. In another embodiment, the microcontroller circuit 132 turns on the microcontroller circuit 132 at least one time when the display device 110 displays one frame.

Figure 2:
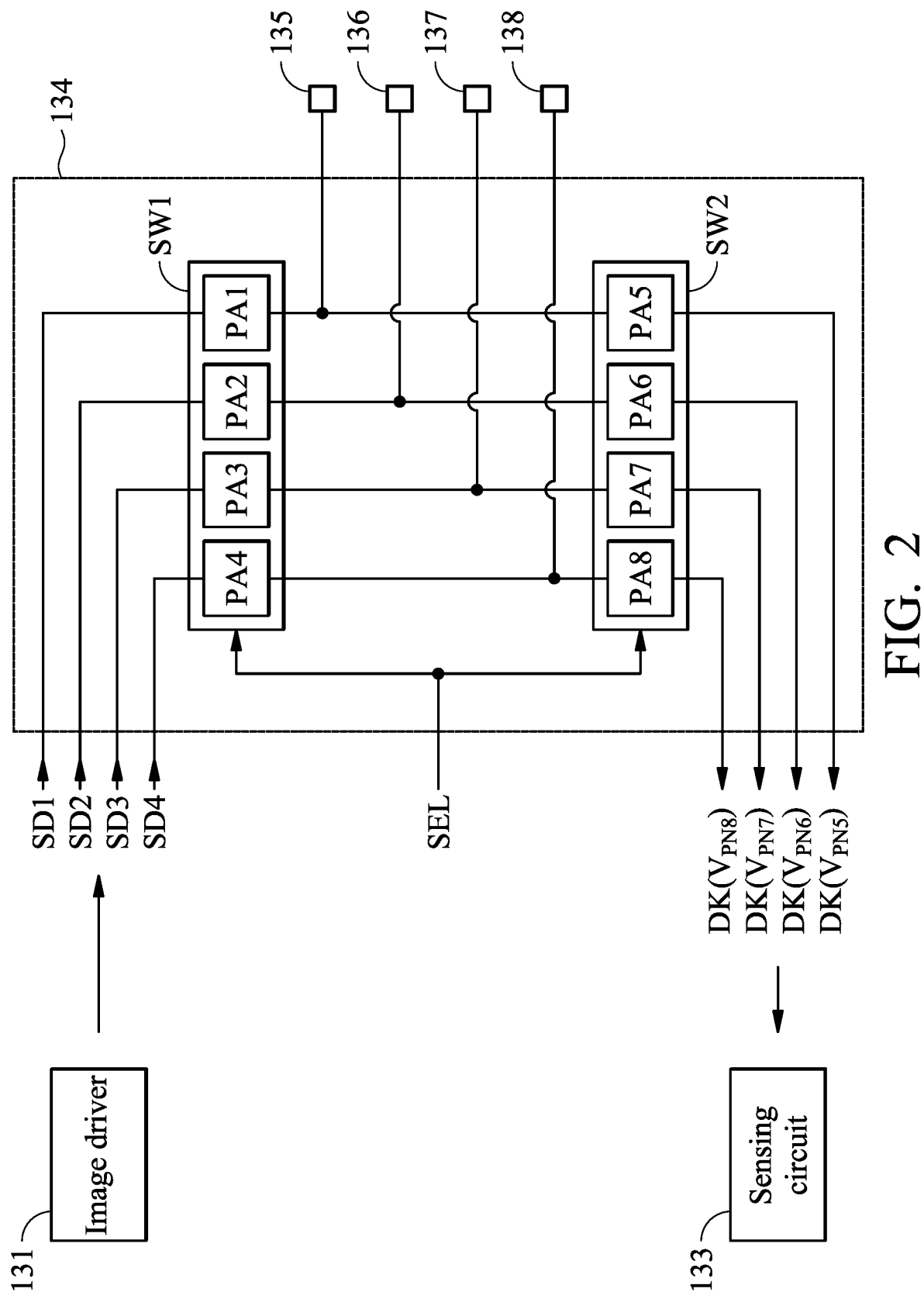
FIG. 2 is a schematic diagram of an exemplary embodiment of a transmission circuit, according to various aspects of the present disclosure.

FIG. 2 is a schematic diagram of an exemplary embodiment of the transmission circuit 134, according to various aspects of the present disclosure. As shown in FIG. 2, the switching circuit SW1 is coupled between the image driver 131 and the input-output pins 135~138 and comprises paths PA1~PA4. In this embodiment, the paths PA1~PA4 transmit the driving signals SD1~SD4 to the input-output pins 135~138 according to the switching signal SEL.

For example, when the switching signal SEL turns on the paths PA1~PA4, the paths PA1~PA4 transmit the driving signals SD1~SD4 to the input-output pins 135~138. When the switching signal SEL does not turn on the paths PA1~PA4, the paths PA1~PA4 stop transmitting the driving signals SD1~SD4 to the input-output pins 135~138. The structure of switching circuit SW1 is not limited in the present disclosure. In one embodiment, the switching circuit SW1 comprises a plurality of switches to form the paths PA1~PA4. In this embodiment, the paths PA1~PA4 are simultaneously turned on or off. In other embodiments, when one of the paths PA1~PA4 is turned on, another of the paths PA1~PA4 is turned off.

The switching circuit SW2 comprises paths PA5~PA8. The path PA5 is coupled between the sensing circuit 133 and the input-output pin 135 and transmits the reference voltage DK and the voltage $V_{PN5}$ of the pin $PN_5$ according to the switching signal SEL. The path PA6 is coupled between the sensing circuit 133 and the input-output pin 136 and transmits the reference voltage DK and the voltage $V_{PN6}$ of the pin $PN_6$ according to the switching signal SEL. The path PA7 is coupled between the sensing circuit 133 and the input-output pin 137 and transmits the reference voltage DK and the voltage $V_{PN7}$ of the pin $PN_7$ according, to the switching signal SEL. The path PA8 is coupled between the sensing circuit 133 and the input-output pin 138 and transmits the reference voltage DK and the voltage $V_{PN8}$ of the pin $PN_8$ according to the switching signal SEL. For example, when the switching signal SEL turns on the paths PA5~PA8, the paths PA5~PA8 first transmit the reference voltage DK to the input-output pins 135~138 and then transmit the voltages $V_{PN5}$~$V_{PN8}$ of the pins $PN_5$~$PN_8$ to the sensing circuit 133. When the switching signal SEL turns off the paths PA5~PA8, the paths PA5~PA8 stop transmitting the reference voltage DK and the voltages $V_{PN5}$~$V_{PN8}$ of the pins $PN_5$~$PN_8$. In this embodiment, the paths PA5~PA8 may be turned on or off simultaneously. In other embodiments, when one of the paths PA5~PA8 is turned on, another of the paths PA5~PA8 is turned off.

In one embodiment, the paths coupled to the same input-output pin are not simultaneously turned on. Taking the input-output pin 135 as an example, the input-output pin 135 is coupled to the paths PA1 and PA5. In this case, when the path PA1 is turned on, the path PA5 is turned off. When the path PA5 is turned on, the path PA1 is turned off. The structure of the switching circuit SW2 is not limited in the present disclosure. In one embodiment, the switching circuit SW2 comprises a plurality of switches to provide the paths PA5~PA8.

Figure 3:
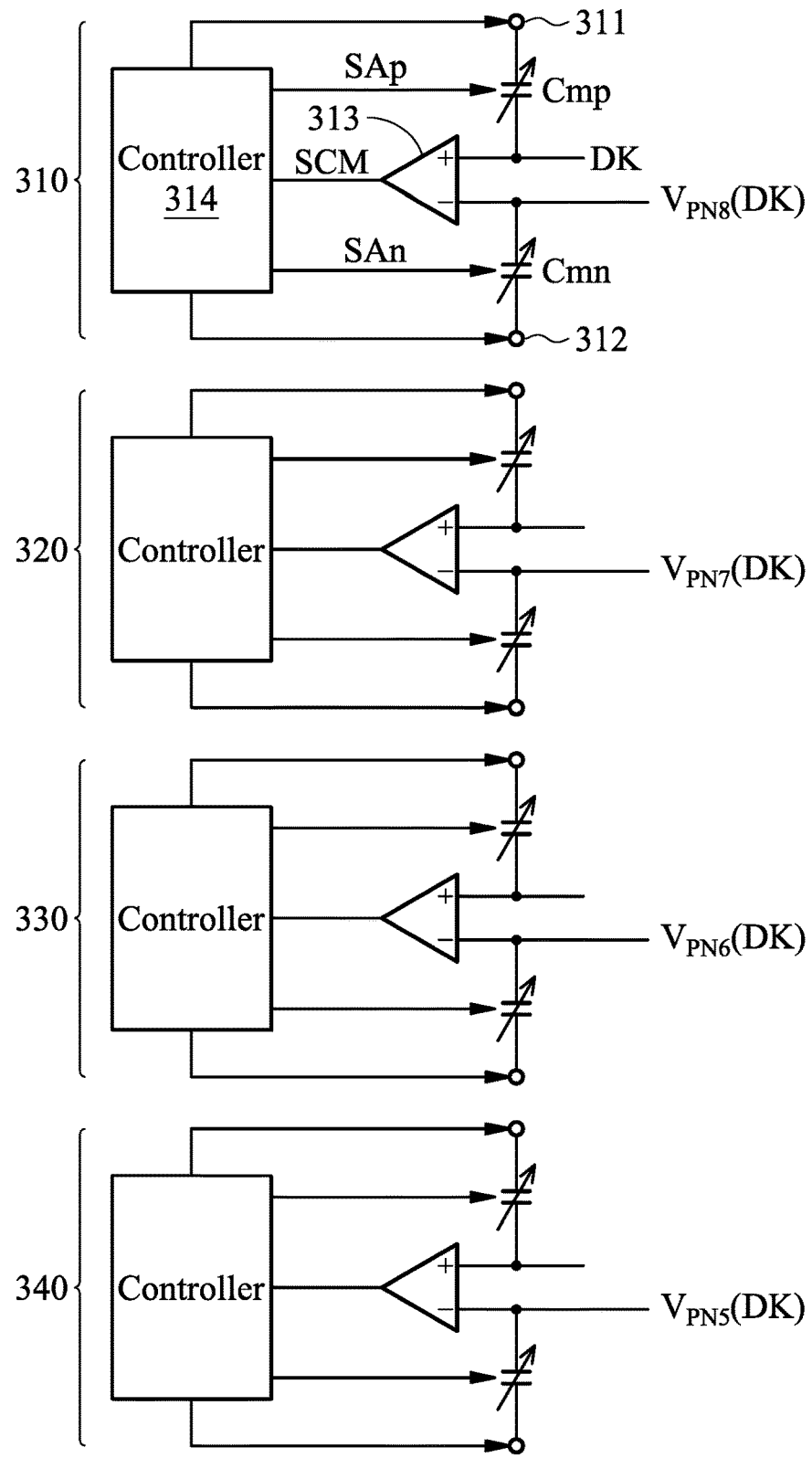
FIG. 3 is a schematic diagram of an exemplary embodiment of a sensing circuit, according to various aspects of the present disclosure.

FIG. 3 is a schematic diagram of an exemplary embodiment of a sensing circuit, according to various aspects of the present disclosure. The sensing circuit 133 comprises sensing units 310~340. The sensing unit 310 determines whether the area 121 of the display device 110 is touched. The sensing unit 320 determines whether the area 122 of the display device 110 is touched. The sensing unit 330 determines whether the area 123 of the display device 110 is touched. The sensing unit 340 determines whether the area 124 of the display device 110 is touched. Since the features of the sensing units 310~340 are the same, the sensing unit 310 is given as an example.

The sensing unit 310 comprises capacitors Cmp and Cmn, a comparator 313 and a controller 314. The capacitor Cmp is coupled between the node 311 and the non-inverted input of the comparator 313 to provide the reference voltage DK. The capacitor Cmn is coupled between the inverted input of the comparator 313 and the node 312. In other embodiments, the capacitor Cmn may be coupled to the inverted input of the comparator 313 and the node 311. In this embodiment, the capacitors Cmp and Cmn are variable capacitors.

The non-inverted input of the comparator 313 is coupled to the capacitor Cmp to receive the reference voltage DK. The inverted input of the comparator 313 receives the voltage $V_{PN8}$ of the pin $PN_8$ and is coupled to the capacitor Cmn. In this embodiment, the comparator 313 compares the reference voltage DK and the voltage $V_{PN8}$ to generate a compared signal SCM.

The controller 314 determines whether a specific area (e.g., the area 124) of the capacitive touch device 120 is touched according to the compared signal SCM. In one embodiment, the controller 314 first generates the reference voltage DK and provides the reference voltage DK to the non-inverted input of the comparator 313. Then, the controller 314 determines whether a specific area of the capacitive touch device 120 is touched according to the voltage of the inverted input of the comparator 313. In this embodiment, the controller 314 obtains the touch pressure according to the voltage of the inverted input of the comparator 313.

For example, in an initial period, the controller 314 first provides a predetermined voltage to the nodes 311 and 312. Therefore, the capacitors Cmp and Cmn start to store charge to generate the reference voltage DK. At this time, the voltages at the inverted input and the non-inverted input of the comparator 313 are equal to the reference voltage DK. If the switching circuit SW2 is turned on, the switching circuit SW2 transmits the reference voltage DK to the pins $PN_5$~$PN_8$ of the capacitive touch device 120.

In such cases, when the area 124 of the capacitive touch device 120 is touched, the capacitance of the sensing element 128 in the area 124 is changed such that the voltage $V_{PN8}$ of the pin $PN_8$ is changed and is not equal to the reference voltage DK. Since the voltage (i.e., $V_{PN8}$) of the inverted input of the comparator 313 is not equal to the voltage (DK) of the non-inverted input, the controller 314 obtains that the area 124 is touched.

In one embodiment, the controller 314 generates adjustment signals Sap and San to adjust the capacitances of the capacitors Cmp and Cmn such that the voltage of the inverted input of the comparator 313 is equal to the voltage (DK) of the non-inverted input of the comparator 313. After the voltage of the inverted input of the comparator 313 is equal to the voltage of the non-inverted input of the comparator 313, the controller 314 obtains the touch strength according to the amplitude of the capacitance of the capacitors Cmp and Cmn being adjusted. In one embodiment, the controller 314 generates a notification signal to notify the microcontroller circuit 132 that a touch event occurs.

Figure 4:
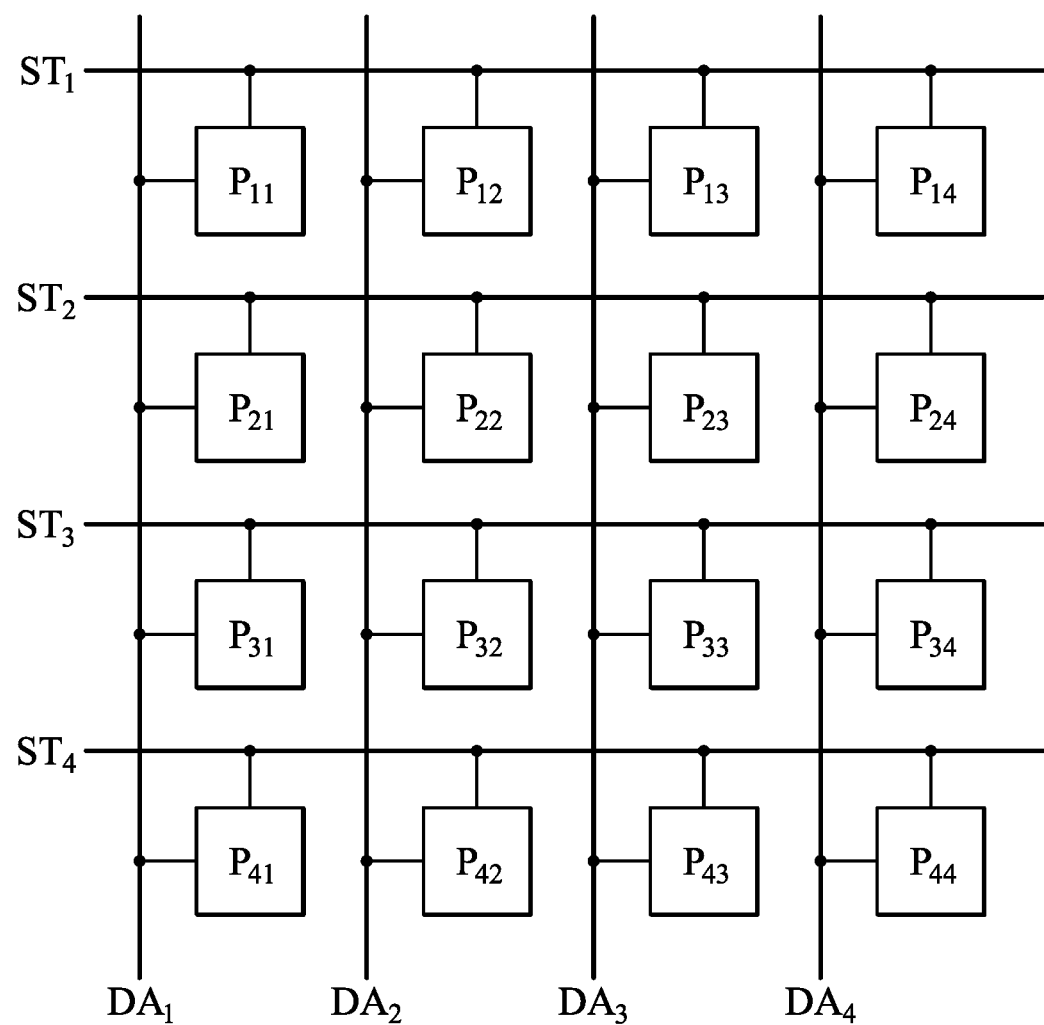
FIG. 4 is a schematic diagram of an exemplary embodiment of a display device, according to various aspects of the present disclosure.

FIG. 4 is a schematic diagram of an exemplary embodiment of the display device 100, according to various aspects of the present disclosure. As shown in FIG. 4, the display device 100 comprises pixels $P_{11}$~$P_{44}$, but the disclosure is not limited thereto. In other embodiments, the display device 100 comprises more or fewer pixels. In this embodiment, the display device 100 is an active matrix (AM) liquid-crystal display device. In such cases, the pixels $P_{11}$~$P_4$ receive and store data signals $DA_1$~$DA_4$ according to turn-on signals $ST_1$~$ST_4$. Taking the pixel $P_{11}$ as an example, the pixel $P_{11}$ receives and stores the data signal $SD_1$ according to the turn-on signal $ST_1$. In one embodiment, each of the pixels $P_{11}$~$P_{44}$ comprises a storage capacitor (now shown) to store the data signals $DA_1$~$DA_4$.

In one embodiment, the turn-on signals $ST_1$~$ST_4$ are driving signals SD1~SD4. In this case, the data signals $DA_1$~$DA_4$ may be generated by the image driver 131. The image driver 131 provides the data signals $DA_1$~$DA_4$ to the display device 110 via other input-output pins. These input-output pins transmitting the data signals $DA_1$~$DA_4$ may be coupled to or not coupled to the capacitive touch device 120.

In another embodiment, the data signals $DA_1$~$DA_4$ are the driving signals SD1~SD4. In this case, the image driver 131 may provide the turn-on signals $ST_1$~$ST_4$ to the display device 110 via other input-output pins. These input-output pins transmitting the turn-on signals $ST_1$~$ST_4$ may be coupled to or not coupled to the capacitive touch device 120.

In other embodiments, the driving signals SD1~SD4 are COM/SEG signals. In this case, the pixels $P_{11}$~$P_{44}$ receive and store the data signals $DA_1$~$DA_4$ according to the turn-on signals $ST_1$~$ST_4$ and the COM/SEG signals.

In some embodiment, the display device 100 is a passive matrix (PM) display device. In such cases, the driving signals SD1~SD4 may be referred to as common signals, and the data signals $DA_1$~$DA_4$ may be referred to as segment signals. The levels of the driving signals SD1~SD4 and data signals $DA_1$~$DA_4$ are utilized to adjust the tilt angles of the liquid-crystal molecules of the pixels $P_{11}$~$P_{44}$, thereby changing the light transmittance of the display device 100. In one embodiment, the pixels $P_{11}$~$P_{44}$ do not have any memory function. Therefore, when the driving signals SD1~SD4 and the data signals $DA_1$~$DA_4$ disappear, the liquid-crystal molecules of the pixels $P_{11}$~$P_{44}$ return to their original positions.

In some embodiments, the display device 110 further comprises a driving circuit (not shown). In this case, the driving circuit may generate the turn-on signals $ST_1$~$ST_4$ or the data signals $DA_1$~$DA_4$ according to the driving signals SD1~SD4. In other embodiments. The driving circuit of the display device 110 generates the turn-on signals $ST_1$~$ST_4$ and the data signals $DA_1$~$DA_4$ according to the driving signals SD1~SD4.

In this embodiment, since the display device 110 and the capacitive touch device 120 share the input-output pins (e.g., 135~138), the number of input-output pins of the control circuit 130 is reduced. Furthermore, since the voltages $V_{PN5}$~$V_{PN8}$ of the pins $PN_5$~$PN_8$ of the capacitive touch device 120 are extremely lower than the voltages of the pins $PN_1$~$PN_4$ of the display device 110, the display device 110 is not interfered by the voltages $V_{PN5}$~$V_{PN8}$. Additionally, the duration which the capacitive touch device 120 outputs the voltages $V_{PN5}$~$V_{PN8}$ is short, the voltages $V_{PN5}$~$V_{PN8}$ do not affect the display device 110.

Figure 5A:
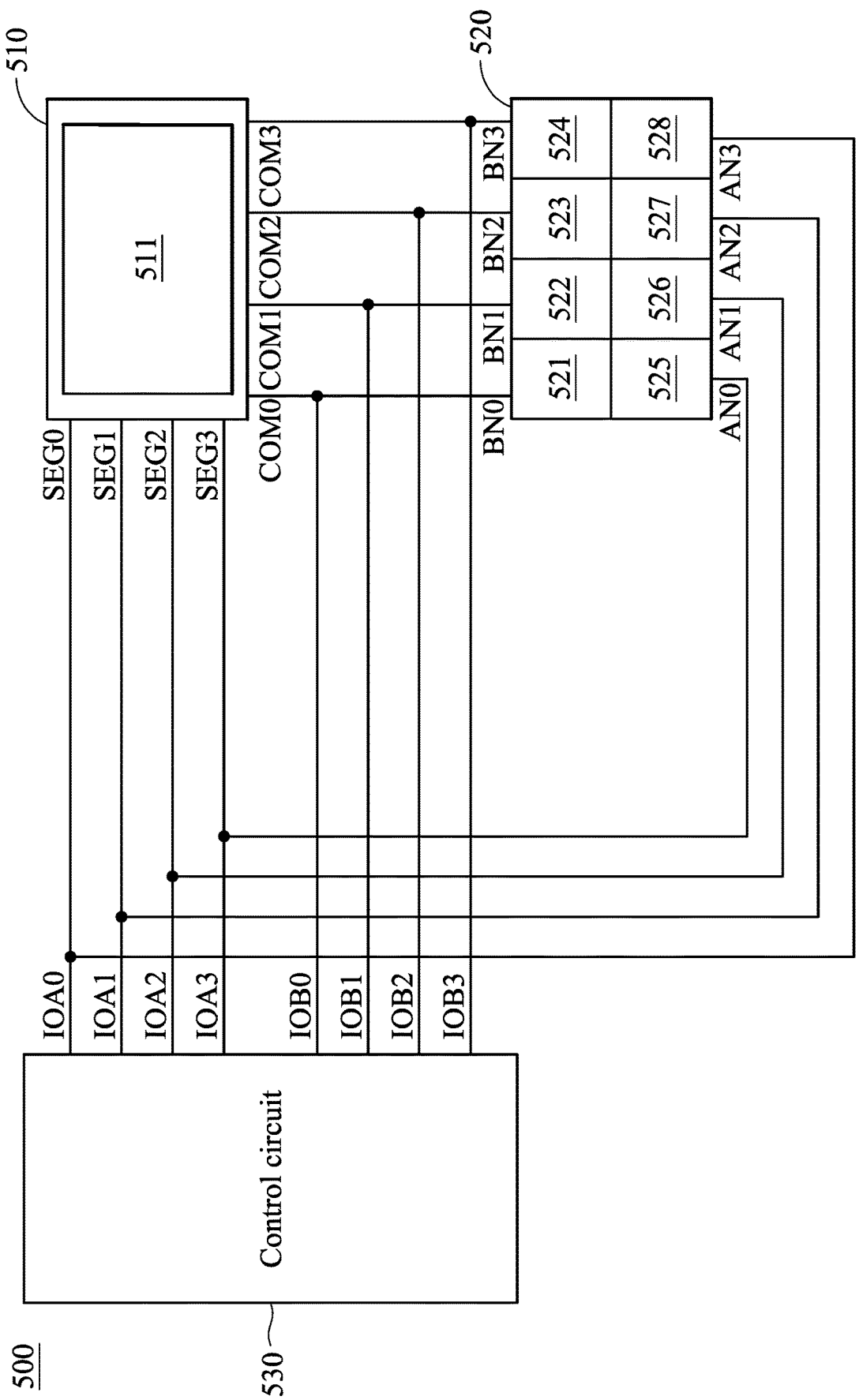
FIG. 5A is a schematic diagram of another exemplary embodiment of the operating system according to various aspects of the present disclosure.

FIG. 5A is a schematic diagram of another exemplary embodiment of the operating system according to various aspects of the present disclosure. As shown in FIG. 5A, the operating system 500 comprises a display device 510, a capacitive touch device 520, and a control circuit 530. In one embodiment, the operation system 500 is a display system. In such cases, the display device 510, the capacitive touch device 520, and the control circuit 530 are combined in a display apparatus.

The display device 510 comprises a display area 511, input pins SEG0~SEG3, and COM0~COM3. In one embodiment, each of the input pins SEG0~SEG3 receives a segment signal, and each of the input pins COM0~COM3 receives a common signal. The display area 511 comprises a plurality of pixels (not shown). Each pixel is coupled to one of the input pins SEG0~SEG3 and one of the input pins COM0~COM3. Each pixel is activated according to the voltage difference between one of the input pins SEG0~SEG3 and one of the input pins COM0~COM3.

The kind of display device 510 is not limited in the present disclosure. In one embodiment, the display device 510 is an AM display device. In such case, each pixel may comprise a driving transistor (not shown) and a storage capacitor (not shown), The driving transistor charges the storage capacitor to activate the corresponding pixel.

In another embodiment, the display device 510 is a PM display device, such as a twisted nematic liquid-crystal display (TN LCD) panel or a super twisted nematic liquid-crystal display (STN LCD) panel. In such cases, each pixel in PM display device may comprise a liquid-crystal capacitor. There is not a driving transistor and a storage capacitor in each pixel. One terminal of the liquid-crystal capacitor is directly connected to one of the input pins SEG0~SEG3. The other terminal of the liquid-crystal capacitor is directly connected to one of the input pins COM0~COM3.

In other embodiment, the display device 510 is a PM organic light-emitting diode (OLED) display device. In such cases, each pixel of the display device 510 only comprises an OLED. There is not a driving transistor and a storage capacitor in each pixel. One terminal (e.g., a cathode) of the OLED is directly connected to one of the input pins SEG0~SEG3. The other terminal (e.g., an anode) of the OLED is directly connected to one of the input pins COM0~COM3.

The capacitive touch device 520 comprises sensing areas 521~528, sensing pins AN0~AN3, and BN0~BN3. In one embodiment, each sensing area has at least one sensing element, such as a touch sensor. The sensing element is configured to determine whether the corresponding sensing area is touched. Since the features of the sensing elements in the sensing areas 521~528 are the same as the features of the sensing elements 125~128 shown in FIG. 1, the descriptions of the features of the sensing elements in the sensing areas 521~528 are omitted.

The sensing pins AN0~AN3, and BN0~BN3 output the signals generated by the sensing elements. In one embodiment, each sensing area has one sensing element. In this case, each of sensing pins AN0~AN3, and BN0~BN3 corresponds one sensing element. For example, the sensing elements of the sensing areas 521~524 are electrically connected to the sensing pins BN0~BN3, respectively. The sensing elements of the sensing areas 525~528 are electrically connected to the sensing pins AN0~AN3, respectively. In this embodiment, the sensing pins AN0~AN3 are electrically connected to the input pins SEG3~SEG0, respectively. The sensing pins BN0~BN3 are electrically connected to the input pins COM0~COM3, respectively.

In other embodiments, the capacitive touch device 520 may comprise more sensing areas or fewer sensing areas, and more sensing pins or fewer sensing pins. The invention is not limited to the kind of capacitive touch device 520. In one embodiment, the capacitive touch device 520 is a touch keyboard or a touch pad. In other embodiment, the capacitive touch device 520 may cover the display device 510.

The control circuit 530 comprises input-output pins IOA0~IOA3 and IOB0~IOB3. The input-output pins IOA0~IOA3 are electrically connected to the input pins SEG0~SEG3 and the sensing pins AN3~AN0. The input-output pins IOB0~IOB3 are electrically connected to the input pins COM0~COM3 and the sensing pins BN0~BN3. In this embodiment, since the display device 510 and the capacitive touch device 520 share the input-output pins IOA0~IOA3 and IOB0~IOB3. Therefore, the number of the input-output pins of the control circuit 530 is reduced.

In a display period, the control circuit 530 provides the segment signals to the input pins SEG0~SEG3 via the input-output pins IOA0~IOA3 and provides the common signals to the input pins COM0~COM3 via the input-output pins IOB0~IOB3. At this time, the display device 510 displays an image according to the levels of the input pins SEG0~SEG3 and COM0~COM3.

In a first sensing period, the control circuit 530 scans a portion of the input-output pins IOA0~IOA3 and IOB0~IOB3 to determine whether the capacitive touch device 520 is touched. The scanned input-output pins are classified into a first pin group. At this time, the control circuit 530 may set the voltage levels of the other portion of the input-output pins IOA0~IOA3 and IOB0~IOB3 to a first predetermined level. The set input-output pins are classified into a second pin group. In other embodiments, the control circuit 530 may set the impedance of each pin of the second pin group at a high impedance. In the first sensing period, when all of the pins in the first pin group have been scanned by the control circuit 530, the control circuit 530 may scan the voltage levels of all of the pins in the second pin group. At this time, the control circuit 530 sets the level of each pins in the first pin group to a second predetermined level or set the impedance of each pins in the first pin group to a high impedance.

In other embodiments, the control circuit 530 scans the levels of all pins in the second pin group in a second sensing period. In such cases, the control circuit 530 sets the voltage level of each pin in the first pin group to a second predetermined level or sets the impedance of each pin in the second pin group to a high impedance.

In one embodiment, the input-output pins IOA0~IOA3 transmit the same kind of signals. Therefore, the control circuit 530 classifies the input-output pins IOA0~IOA3 into the first pin group. Additionally, the input-output pins IOB0~IOB3 transmit the same kind of signals. Therefore, the control circuit 530 classifies the input-output pins IOB0~IOB3 into the second pin group.

Figure 5B:
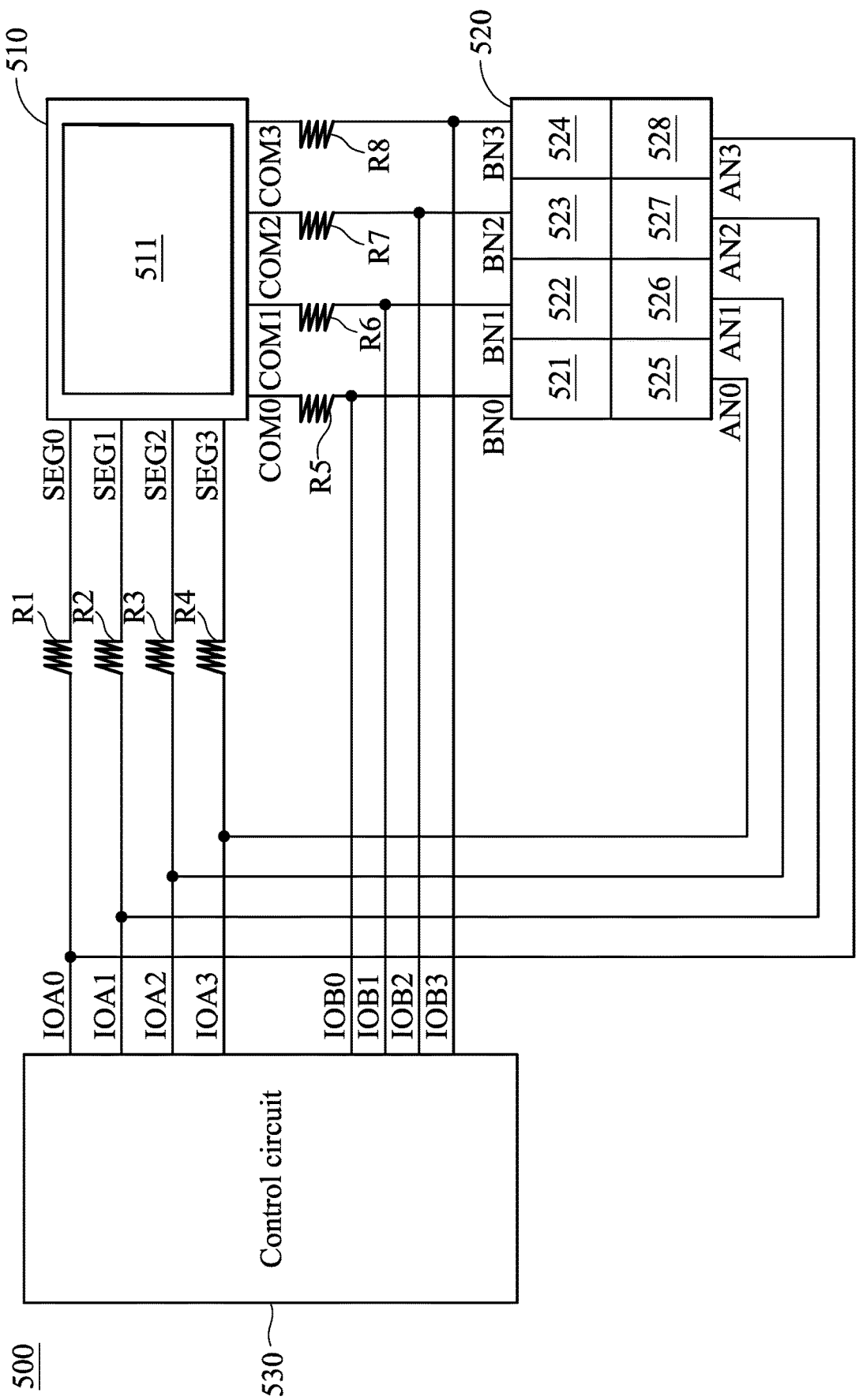
FIG. 5B is a schematic diagram of another exemplary embodiment of the operating system according to various aspects of the present disclosure.

FIG. 5B is a schematic diagram of another exemplary embodiment of the operating system according to various aspects of the present disclosure. FIG. 5B is similar to FIG. 5A except for the addition of resistors R1~R8. The resistors R1~R4 are coupled between the input-output pins IOA0~IOA3 and the input pins SEG0~SEG3, respectively. The resistors R5~R8 are coupled between the input-output pins IOB0~IOB3 and the input pins COM0~COM3, respectively. Taking the resistors R1 and R5 as an example, the resistor R1 is coupled between the input-output pin IOA0 and the input pin SEG0, and the resistor R5 is coupled between the input-output pins IOB0 and the input pin COM0. In one embodiment, the resistance of each of resistors R1~R8 is within 1 KΩ~10 KΩ.

In some embodiments, the display device 510 is a liquid-crystal display device. The existence of resistors R1~R8 increase the accuracy of the sensing operation. In such cases, the control circuit 530 performs the sensing operation to detect the touched area in the capacitive touch device 520.

FIGS. 6A~6D are schematic diagrams of the variations of the voltage levels of a first pin group and a second pin group.

Assume that the input-output pins IOA0~IOA3 is classified into a first pin group, and the input-output pins IOB0~IOB3 is classified into a second pin group. Since the variations of the voltage levels of the input-output pins IOA0~IOA3 are the same, only the variation of the voltage level of the input-output pin IOA0 is shown in FIGS. 6A~6D. Furthermore, since the variations of the voltage levels of the input-output pins IOB0~IOB3 are the same, only the variation of the voltage level of the input-output pin IOB0 is shown in FIGS. 6A~6D.

Figure 6A:
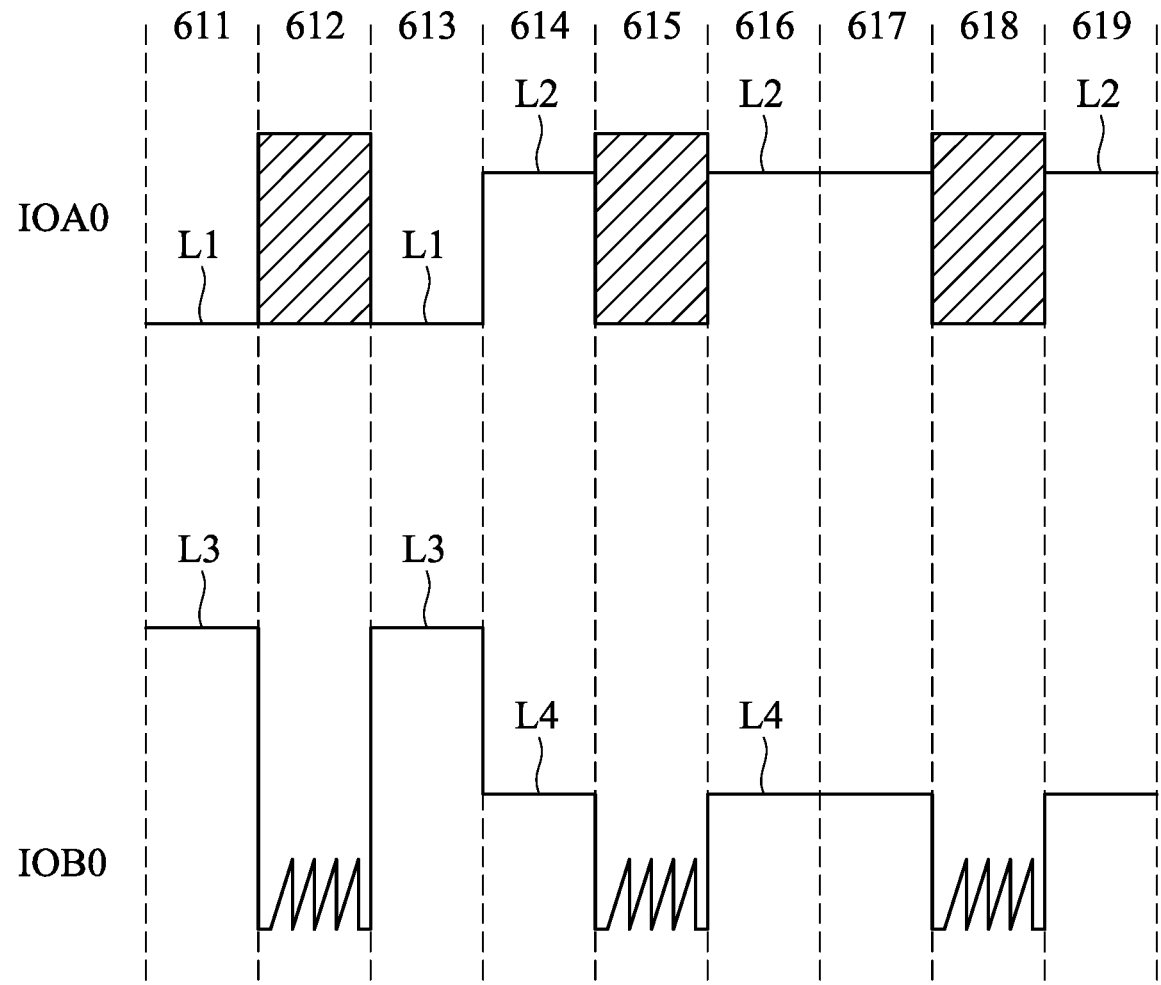
FIGS. 6A-6D are schematic diagrams of the variations of the voltage levels of a first pin group and a second pin group.

Refer to FIG. 6A, in the display period 611, the control circuit 530 sets the voltage level of the input-output pin IOA0 to the level L1 and sets the voltage level of the input-output pin IOB0 to the level L3. At this time, the display device 510 displays an image according to the voltage levels of the input-output pins IOA0 and IOB0. In the sensing period 612, the control circuit 530 sets the voltage level of the input-output pin IOA0 (first pin group) to a floating level. In one embodiment, the control circuit 530 does not provide any voltage to the input-output pin IOA0. In such cases, the impedance of the input-output pin IOA0 is a high impedance. Therefore, the voltage level of the input-output pin IOA0 is a floating level. In the sensing period 612, the control circuit 530 detects the voltage level of the input-output pin IOB0 (second pin group). In one embodiment, the control circuit 530 provides the reference voltage DK to the input-output pin IOB0 and then determines whether the voltage level of the input-output pin IOB0 is changed. When the voltage level of the input-output pin IOB0 is changed, it means that a sensing area corresponding to the input-output pin IOB0 is touched. In some embodiments, the control circuit 530 sequentially detects the voltage levels of the input-output pins IOB0~IOB3 (second pin group) in the sensing period 612. In the display period 613, the control circuit 530 sets the voltage level of the input-output pin IOA0 to the level L1 and sets the voltage level of the input-output pin IOB0 to the level L3 again. Therefore, the display device 510 displays a corresponding image.

In the display period 614, the control circuit 530 sets the voltage level of the input-output pin IOA0 to the level L2 and sets the voltage level of the input-output pin IOB0 to the level L4. In the sensing period 615, the control circuit 530 sets the voltage level of the input-output pin IOA0 to a floating level. At this time, the control circuit 530 detects the voltage levels of the input-output pins IOB0~IOB3. In the display period 616, the control circuit 530 sets the voltage level of the input-output pin IOA0 to the level L2 and sets the voltage level of the input-output pin IOB0 to the level L4.

In the display period 617, the control circuit 530 sets the voltage level of the input-output pin IOA0 to the level L2 and sets the voltage level of the input-output pin IOB0 to the level L4. In the sensing period 618, the control circuit 530 sets the voltage level of the input-output pin IOA0 to a floating level. At this time, the control circuit 530 detects the voltage levels of the input-output pins IOB0~IOB3. In the display period 619, the control circuit 530 sets the voltage level of the input-output pin IOA0 to the level L2 and sets the voltage level of the input-output pin IOB0 to the level L4.

Figure 6B:
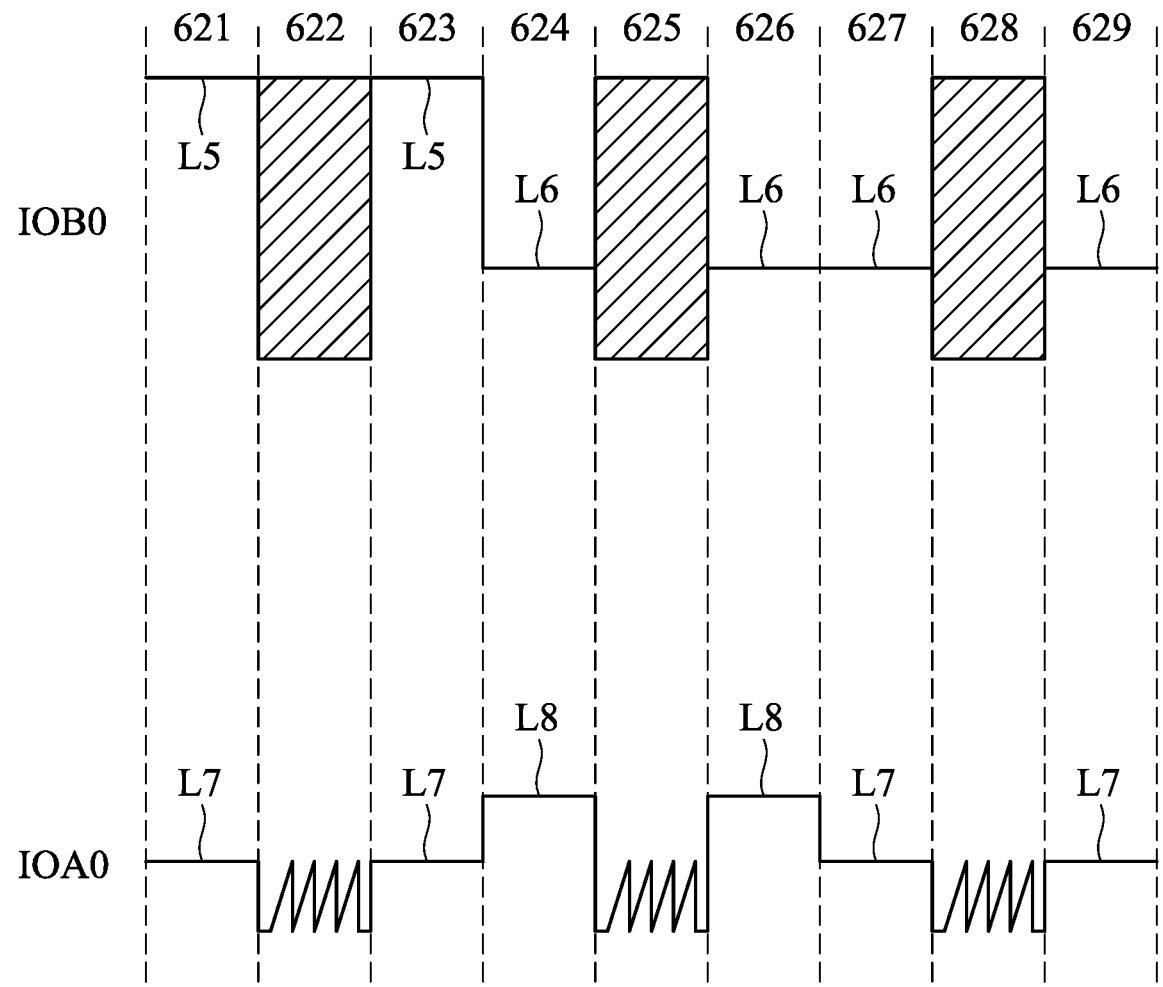

Refer to FIG. 6B, in the display period 621, the control circuit 530 sets the voltage level of the input-output pin IOB0 to the level L5 and sets the voltage level of the input-output pin IOA0 to the level L7. Therefore, the display device 510 displays a corresponding image according to the voltage levels of the input-output pins IOA0 and IOB0. In the sensing period 622, the control circuit 530 sets the voltage level of the input-output pin IOB0 to a floating level and detects the voltage levels of the input-output pins IOA0~IOA3. In the display period 623, the control circuit 530 sets the voltage level of the input-output pin IOB0 to the level L5 and sets the voltage level of the input-output pin IOA0 to the level L7 again. Therefore, the display device 510 displays a corresponding image according to the voltage levels of the input-output pins IOA0 and IOB0.

In the display period 624, the control circuit 530 sets the voltage level of the input-output pin IOB0 to the level L6 and sets the voltage level of the input-output pin IOA0 to the level L8. In the sensing period 625, the control circuit 530 sets the voltage level of the input-output pin IOB0 to a floating level and scans the voltage levels of the input-output pins IOA0~IOA3. In the display period 626, the control circuit 530 sets the voltage level of the input-output pin IOB0 to the level L6 and sets the voltage level of the input-output pin IOA0 to the level L8.

In the display period 627, the control circuit 530 sets the voltage level of the input-output pin IOB0 to the level L6 and sets the voltage level of the input-output pin IOA0 to the level L7. In the sensing period 628, the control circuit 530 sets the voltage level of the input-output pin IOB0 to a floating level. At this time, the control circuit 530 scans the voltage levels of the input-output pins IOA0~IOA3. In the display period 629, the control circuit 530 sets the voltage level of the input-output pin IOB0 to the level L6 and sets the voltage level of the input-output pin IOA0 to the level L7.

Figure 6C:
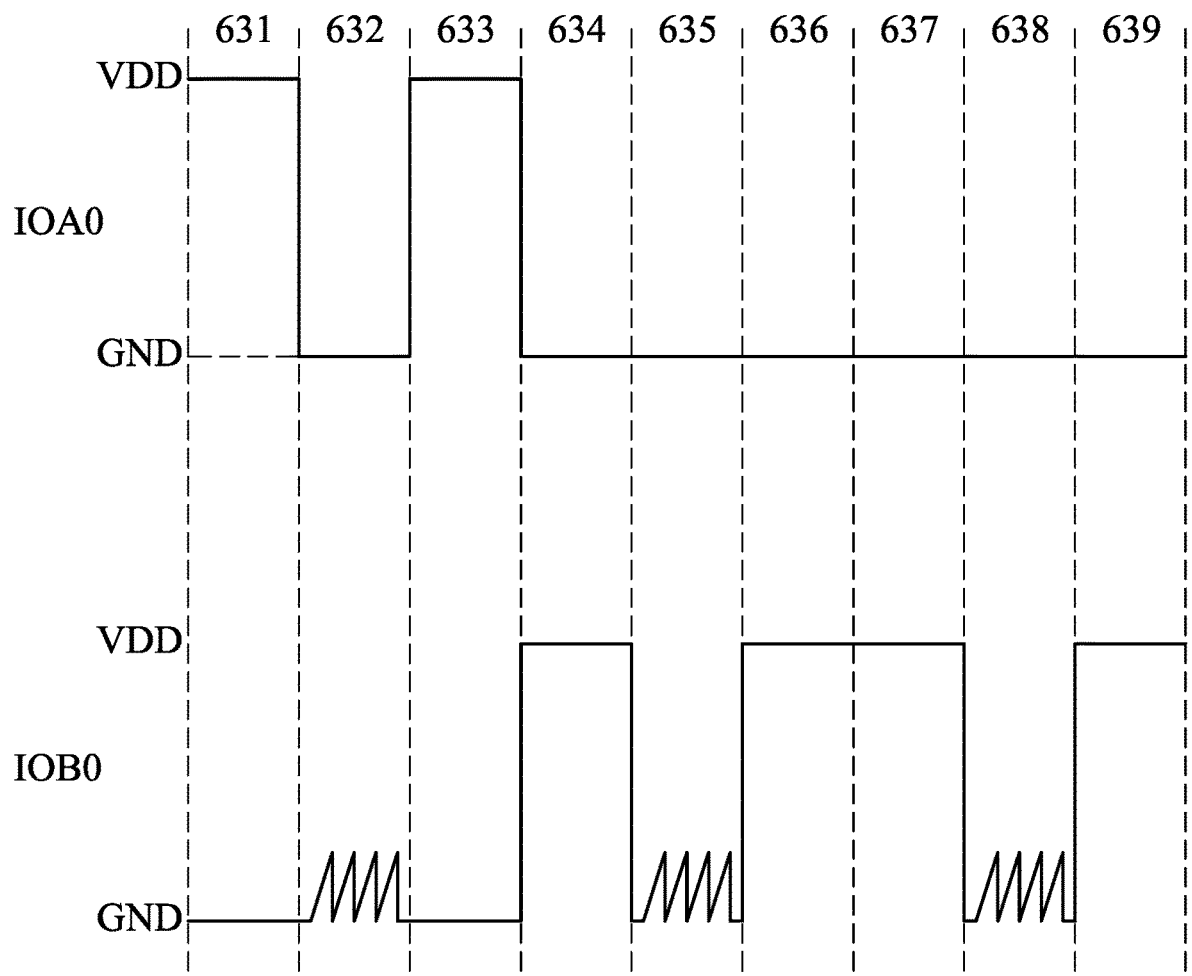

Refer to FIG. 6C, in the display period 631, the control circuit 530 sets the voltage level of the input-output pin IOA0 to the level VDD and sets the voltage level of the input-output pin IOB0 to the level GND. Therefore, the display device 510 displays a corresponding image according to the voltage levels of the input-output pins IOA0 and IOB0. In the sensing period 632, the control circuit 530 sets the voltage level of the input-output pin IOA0 to the level GND (referred to as a first predetermined level) and scans the voltage levels of the input-output pins IOB0~IOB3. In the display period 633, the control circuit 530 sets the voltage level of the input-output pin IOA0 to the level VDD and sets the voltage level of the input-output pin IOB0 to the level GND again. Therefore, the display device 510 displays a corresponding image according to the voltage levels of the input-output pins IOA0 and IOB0.

In the display period 634, the control circuit 530 sets the voltage level of the input-output pin IOA0 to the level GND and sets the voltage level of the input-output pin IOB0 to the level VDD. In the sensing period 635, the control circuit 530 sets the voltage level of the input-output pin IOA0 to the level GND. At this time, the control circuit 530 scans the voltage levels of the input-output pins IOB0~IOB3. In the display period 636, the control circuit 530 sets the voltage level of the input-output pin IOA0 to the level GND and sets the voltage level of the input-output pin IOB0 to the level VDD.

In the display period 637, the control circuit 530 sets the voltage level of the input-output pin IOA0 to the level GND and sets the voltage level of the input-output pin IOB0 to the level VDD. In the sensing period 638, the control circuit 530 sets the voltage level of the input-output pin IOA0 to the level GND. At this time, the control circuit 530 scans the voltage levels of the input-output pins IOB0~IOB3. In the display period 639, the control circuit 530 sets the voltage level of the input-output pin IOA0 to the level GND and sets the voltage level of the input-output pin IOB0 to the level VDD.

Figure 6D:
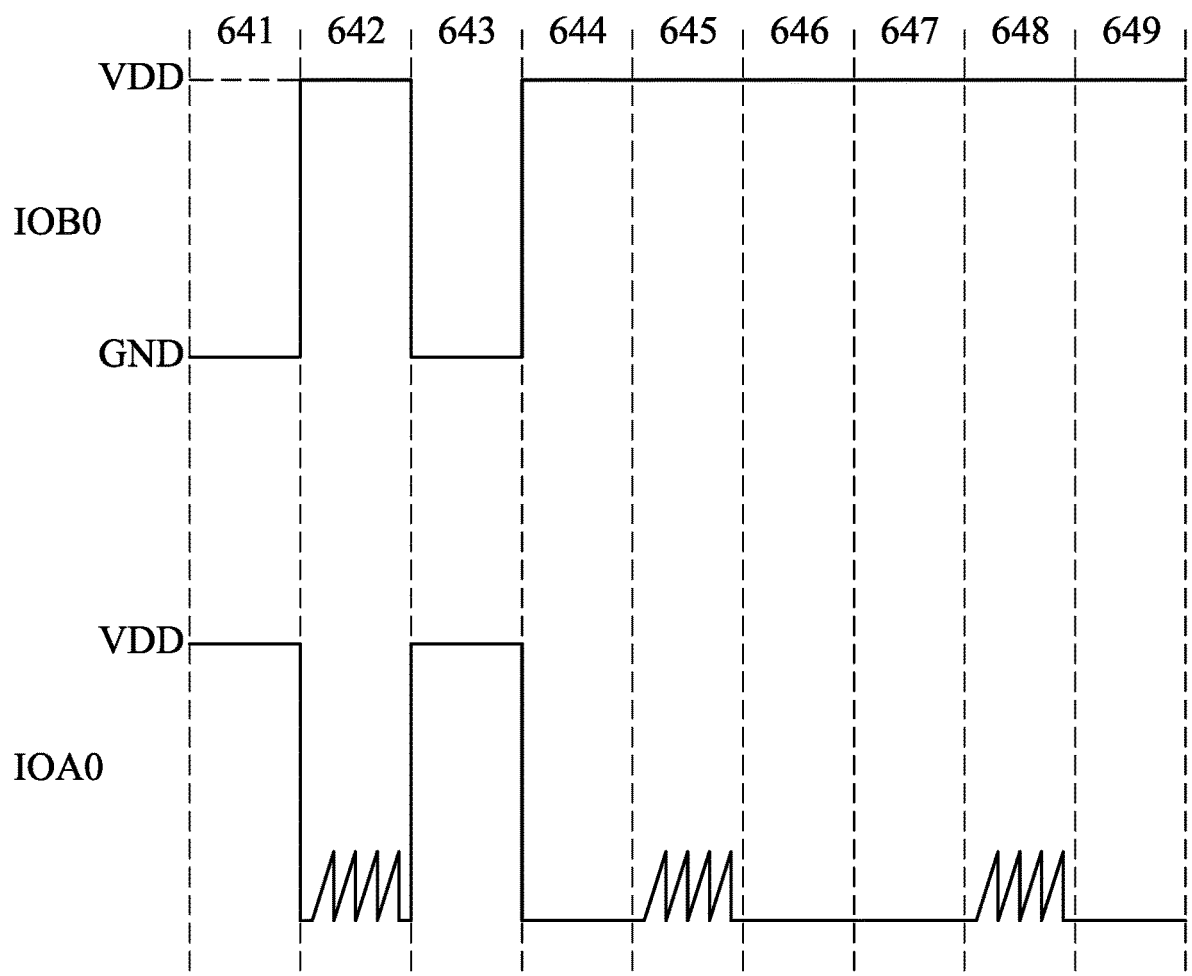

Refer to FIG. 6D, in the display period 641, the control circuit 530 sets the voltage level of the input-output pin IOB0 to the level GND and sets the voltage level of the input-output pin IOA0 to the level VDD. Therefore, the display device 510 displays a corresponding image according to the voltage levels of the input-output pins IOA0 and IOB0. In the sensing period 642, the control circuit 530 sets the voltage level of the input-output pin IOB0 to the level VDD (referred to as a second predetermined level) and scans the voltage levels of the input-output pins IOA0~IOA3. In the display period 643, the control circuit 530 sets the voltage level of the input-output pin IOB0 to the level GND and sets the voltage level of the input-output pin IOA0 to the level VDD again.

In the display period 644, the control circuit 530 sets the voltage level of the input-output pin IOB0 to the level VDD and sets the voltage level of the input-output pin IOA0 to the level GND. In the sensing period 645, the control circuit 530 sets the voltage level of the input-output pin IOB0 to the level VDD. At this time, the control circuit 530 scans the voltage levels of the input-output pins IOA0~IOA3. In the display period 646, the control circuit 530 sets the voltage level of the input-output pin IOB0 to the level VDD and sets the voltage level of the input-output pin IOA0 to the level GND.

In the display period 647, the control circuit 530 sets the voltage level of the input-output pin IOB0 to the level VDD and sets the voltage level of the input-output pin IOA0 to the level GND. In the sensing period 648, the control circuit 530 sets the voltage level of the input-output pin IOB0 to the level VDD. At this time, the control circuit 530 scans the voltage levels of the input-output pins IOA0~IOA3. In the display period 649, the control circuit 530 sets the voltage level of the input-output pin IOB0 to the level VDD and sets the voltage level of the input-output pin IOA0 to the level GND.

Figure 7:
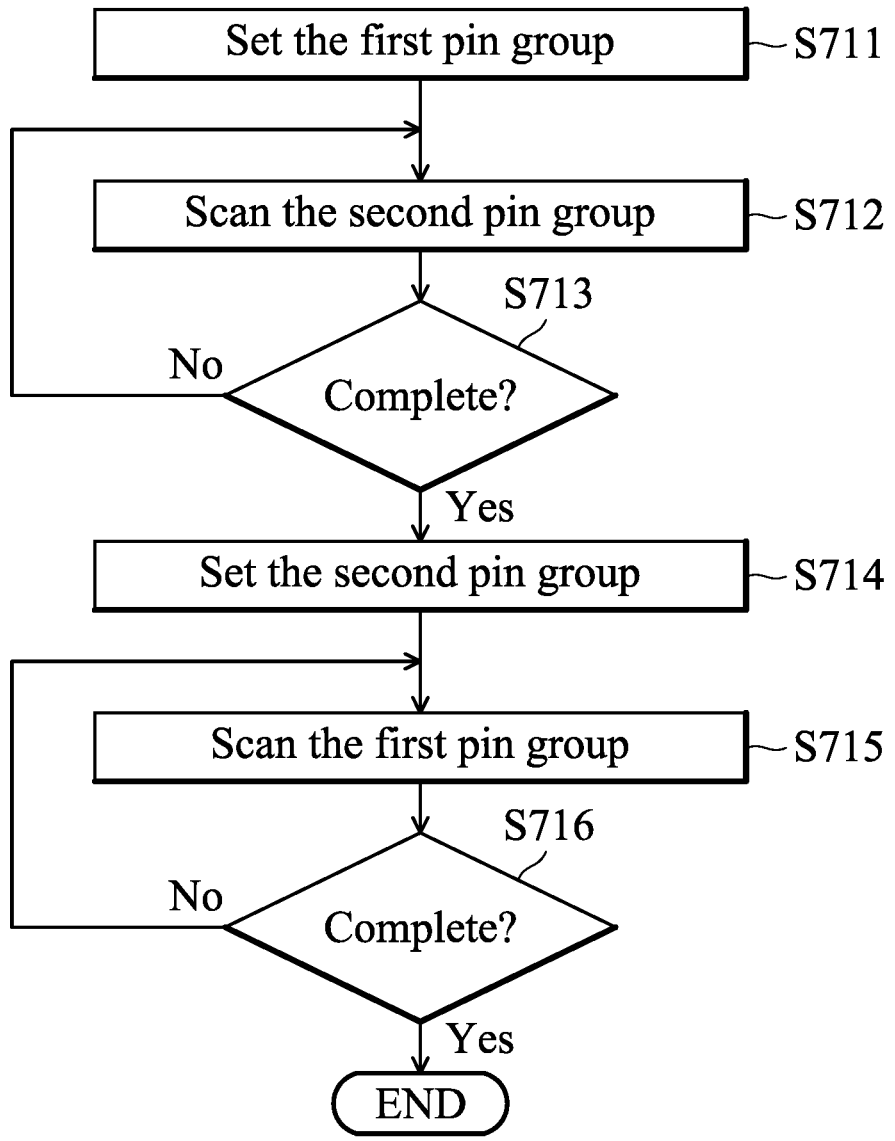
FIG. 7 is a flowchart of an exemplary embodiment of a sensing operation performed by the control circuit according to various aspects of the present disclosure.

FIG. 7 is a flowchart of an exemplary embodiment of a sensing operation performed by the control circuit 530 according to various aspects of the present disclosure. First, the voltage level of each pin of the first pine group is set to a first predetermined level (step S711). Then, the voltage level of each pin of the second pin group is scanned (step S712). Next, a determination is made as to whether the voltage levels of all pins in the second pin group have been scanned (step S713). If the outcome of step S713 is false then step S712 may be performed, else step S714 may be performed. In step S714, the voltage level of each pin of the second pin group is set to a second predetermined level. Then, the voltage level of each pin of the first pin group is detected (step S715). Next, a determination is made as to whether the voltage levels of all pins in the first pin group have been scanned (step S716). If the outcome of step S716 is false then step S715 may be performed, else the sensing operation is finished.

In one embodiment, the second predetermined level in step S714 is opposite to the first predetermined level in step S711. For example, when the first predetermined level is a high level, the second predetermined level is a low level. When the first predetermined level is a low level, the second predetermined level is a high level. In some embodiments, each of the first predetermined level in step S711 and the second predetermined level in step S714 is a floating level.

In such cases, step S711 does not provide any voltage to the first pin group, and step S714 does not provide any voltage to the second pin group.

In other embodiments, steps S714~S716 are performed before than step S711. In such cases, the control circuit 530 sets the voltage level of each pin of the second pin group to the second predetermined level and then scans the voltage level of each pin of the first pin group. After scanning the voltage level of each pin of the first pin group, the control circuit 530 sets the voltage level of each pin of the first pin group to the first predetermined level and then scans the voltage level of each pin of the second pin group.

Figure 8A:
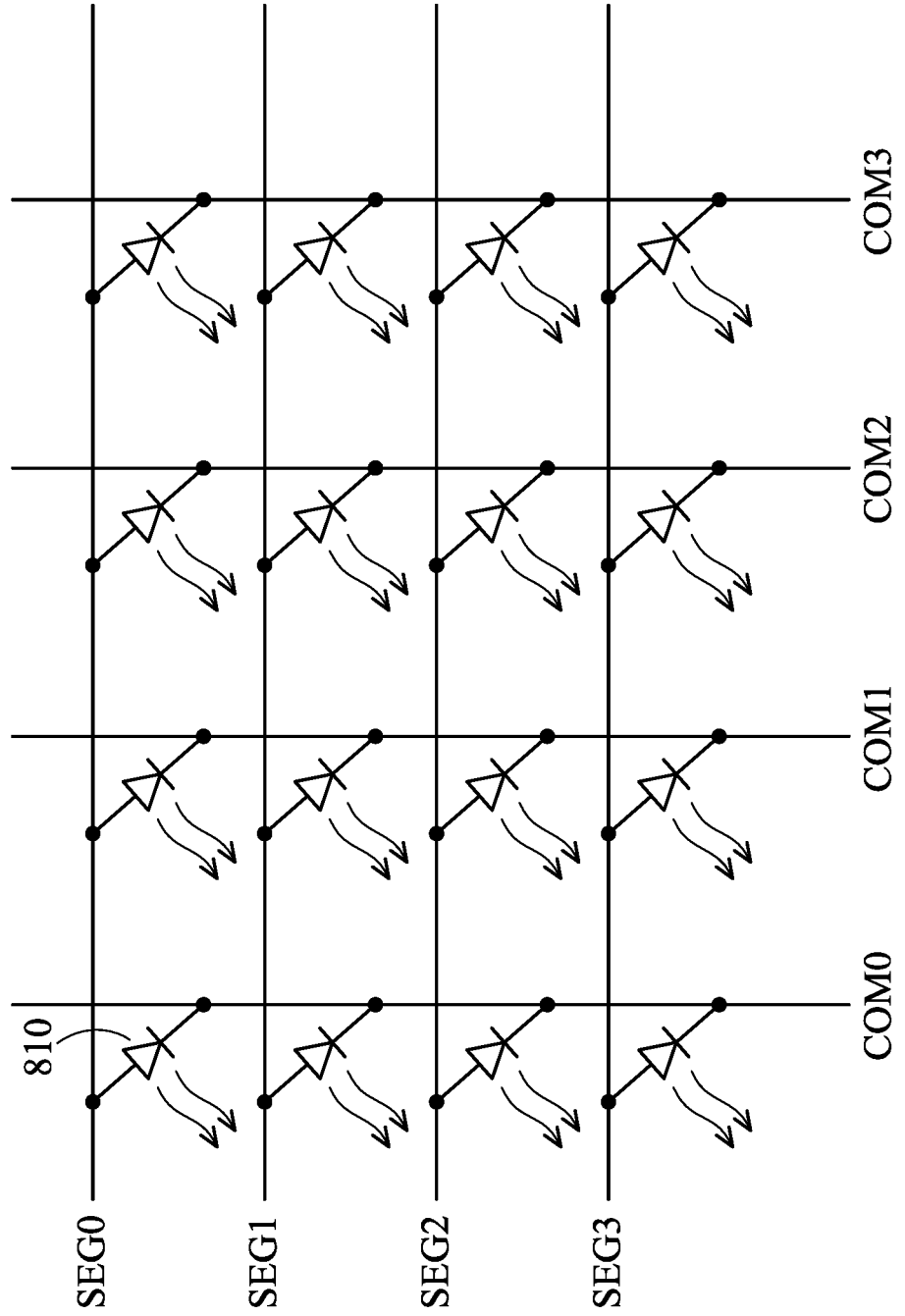
FIG. 8A is a schematic diagram of an exemplary embodiment of a display area according to various aspects of the present disclosure.

FIG. 8A is a schematic diagram of an exemplary embodiment of a display area according to various aspects of the present disclosure. In this case, the display area 800A comprises a plurality of LEDs. Each LED is coupled to one of the input pins SEG0~SEG3 and one of the input pins COM0~COM3. Taking the LED 810 as an example, the cathode of the LED 810 is coupled to the input pin SEG0. The anode of the LED 810 is coupled to the inpu pin COM0. In this case, when the voltage difference between the input pins SEG0 and COM0 is larger than a turn-on voltage of the LED 810, the LED 810 is activated. When the oltage difference between the input pins SEG0 and COM0 is not larger than the turn-on voltage of the LED 810, the LED 810 is deactivated.

In the sensing period, since the voltage levels of the input pins COM0~COM3 may be a high level (referred to as a second predetermined level), even if the input pins SEG0~SEG3 receive small voltage levels, the LED 810 is not turned on. Additionally, since the voltage levels of the input pins SEG0~SEG3 may be a low level (referred to as a first predetermined level), even if the input pins COM0~COM3 receive small voltage levels, the LED 810 is not turned on. Therefore, when the control circuit 530 performs a sensing operation for the capacitive touch device 520 in the sensing period, the display device 510 is not interfered by the sensing operation.

Figure 8B:
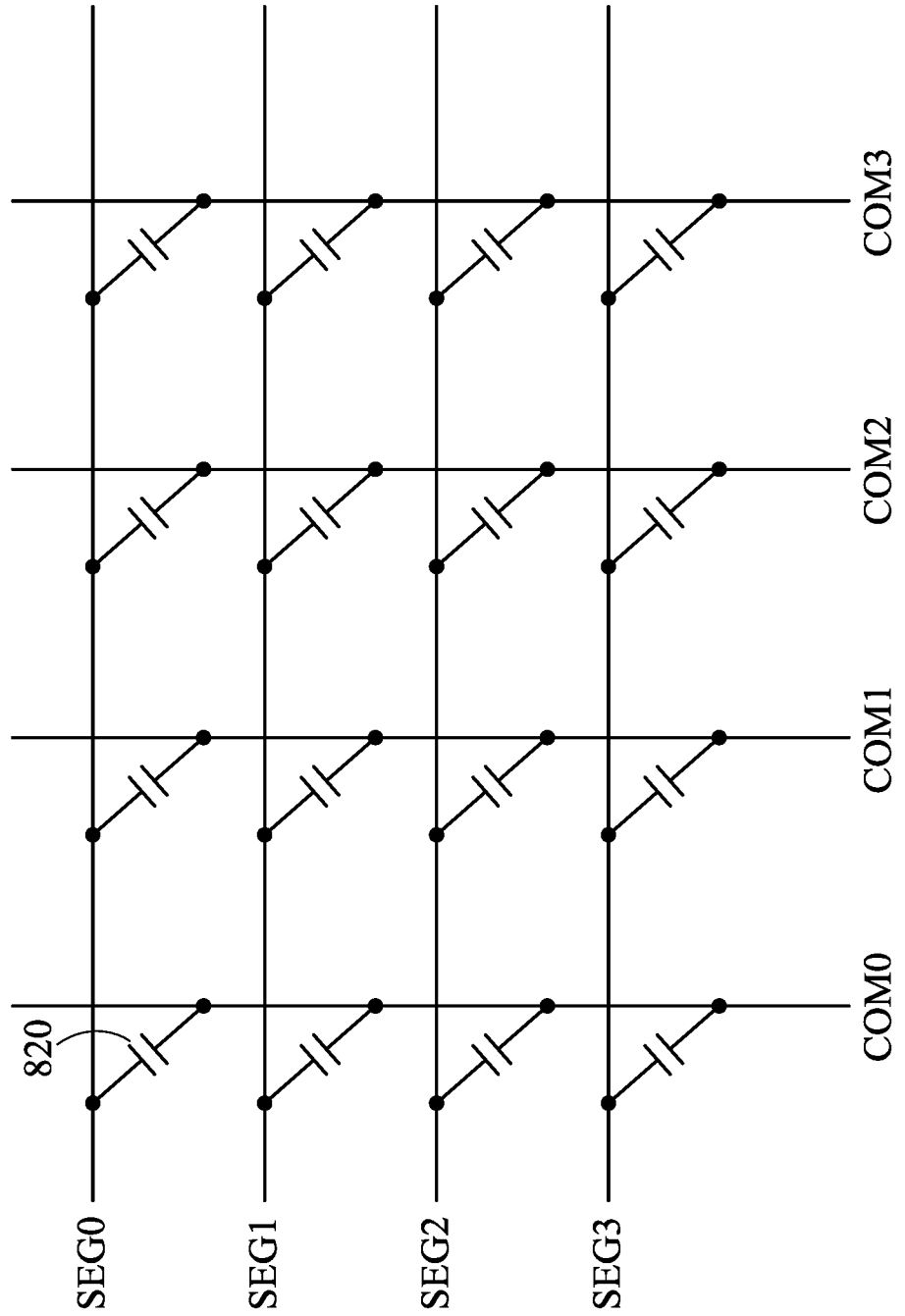
FIG. 8B is a schematic diagram of another exemplary embodiment of the display area according to various aspects of the present disclosure.

FIG. 8B is a schematic diagram of another exemplary embodiment of the display area according to various aspects of the present disclosure. In this embodiment, the display area 800B comprises a plurality of liquid-crystal capacitors. Each of the liquid-crystal capacitor is coupled to one of the input pins SEG0~SEG3 and one of the input pins COM0~COM3. Taking the liquid-crystal capacitor 820 as an example, the liquid-crystal capacitor 820 is coupled between the input pins SEG0 and COM0.

In the sensing period, since the voltage levels of the input pins COM0~COM3 may be a floating level, even if the input pins SEG0~SEG3 receive small voltage levels, the liquid-crystal capacitor 820 does not be charged. Additionally, since the voltage levels of the input pins SEG0~SEG3 may be a floating level, even if the input pins COM0~COM3 receive small voltage levels, the liquid-crystal capacitor 820 does not be charged. Therefore, when the control circuit 530 performs a sensing operation for the capacitive touch device 520 in the sensing period, the display device 510 is not interfered by the sensing operation.

Figure 9:
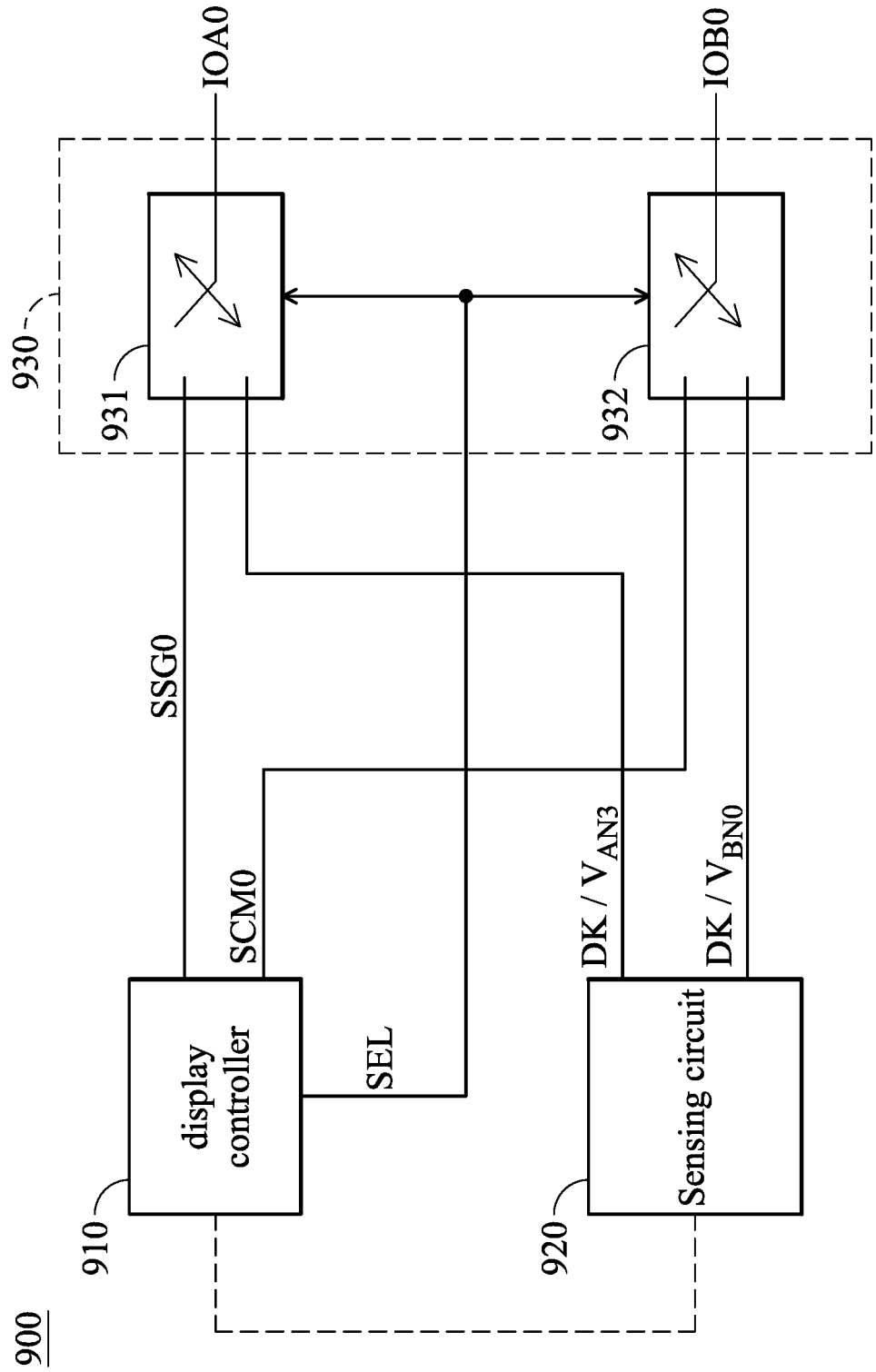
FIG. 9 is a schematic diagram of an exemplary embodiment of the control circuit according to various aspects of the present disclosure.

FIG. 9 is a schematic diagram of another exemplary embodiment of the control circuit according to various aspects of the present disclosure. The control circuit 900 comprises a display controller 910, a sensing circuit 920, and a transmission circuit 930. The display controller 910 is configured to provide the driving signals SSG0 and SCM0, and a switching signal SEL. In one embodiment, the driving signal SSG0 is a segment signal, and the driving signal SCM0 is a common signal. In other embodiments, the display controller 910 combines the image driver 131 and the microcontroller circuit 132 of FIG. 1. In such cases, the driving signal SSG0 serves as one of the driving signals SD1~SD4, and the driving signal SCM0 serves as another of the driving signals SD1~SD4.

The sensing circuit 920 provides the reference voltage DK and receives the sensing voltages $V_{AN3}$ and $V_{BN0}$. In one embodiment, the sensing voltage $V_{AN3}$ is the voltage of the sensing pin AN3 of the capacitive touch device 520, and the sensing voltage $V_{BN0}$ is the voltage of the sensing pin BN0 of the capacitive touch device 520. In other embodiments, the sensing circuit 920 receives fewer sensing voltages or more sensing voltages, such as the voltages of the sensing pins AN0~AN2 and BN1~BN3. Since the feature of sensing circuit 920 is the same as the feature of sensing circuit 133 of FIG. 1, the description of the feature of sensing circuit 920 is omitted.

The transmission circuit 930 selects the output of the display controller 910 or the sensing circuit 920 and transmits the output of the display controller 910 or the sensing circuit 920 to the input-output pins IOA0 and IOB0 according to the switching signal SEL. In one embodiment, the transmission circuit 930 provides the driving signals SSG0 and SCM0 to the input-output pins IOA0 and IOB0 according to the switching signal SE in a display period. In a sensing period, the transmission circuit 930 provides the reference voltage DK to one of the input-output pins IOA0 and IOB0 and sets the level of the other of the input-output pins IOA0 and IOB0 according to the switching signal SEL.

Assume that the input-output pin IOA0 is belong to a first pin group, and the input-output pin IOB0 is belong to a second pin group. In a first sensing period, the display controller 910 directs the transmission circuit 930 to transmit the reference voltage DK to the input-output pin IOA0 and transmit the driving signal SCM0 to the input-output pin IOB0. At this time, the driving signal SCM0 is a first predetermined level. In other embodiments, the display controller 910 directs the transmission circuit 930 to stop transmitting any signal to the input-output pin IOB0. In such cases, the voltage level of the input-output pin IOB0 is a floating level. In some embodiments, when the transmission circuit 930 transmits the reference voltage DK to the input-output pin IOA0, the sensing circuit 920 may provide a first predetermined level, such as a low level or a high level. In such cases, the transmission circuit 930 may transmit the first predetermined level provided by the sensing circuit 920 to the input-output pin IOB0.

In a second sensing period, the display controller 910 directs the transmission circuit 930 to transmit the reference voltage DK to the input-output pin IOB0 and transmit the driving signal SSG0 to the input-output pin IOA0. At this time, the driving signal SSG0 is a second predetermined level. In other embodiments, the display controller 910 directs the transmission circuit 930 to stop transmitting any signal to the input-output pin IOA0. In such cases, the voltage level of the input-output pin IOA0 is a floating level. In some embodiments, when the transmission circuit 930 transmits the reference voltage DK to the input-output pin IOB0, the sensing circuit 920 may provide a second predetermined level, such as a high level or a low level. In such cases, the transmission circuit 930 may transmit the second predetermined level provided by the sensing circuit 920 to the input-output pin IOA0.

After the transmission circuit 930 provides the reference voltage DK to the input-output pin IOA0, the sensing circuit 920 detects the voltage $V_{AN3}$ of the input-output pin IOA0. In such cases, when the voltage $V_{AN3}$ of the input-output pin IOA0 is not equal to the reference voltage DK, it means that a sensing area corresponding to the sensing pin AN3 of the capacitive touch device 520 is touched. Therefore, the sensing circuit 920 informs the display controller 910 such that the display controller 910 performs a corresponding operation.

Similarly, after the transmission circuit 930 provides the reference voltage DK to the input-output pin IOB0, the sensing circuit 920 detects the voltage $V_{BN0}$ of the input-output pin IOB0. In such cases, when the voltage $V_{BN0}$ of the input-output pin IOB0 is not equal to the reference voltage DK it means that a sensing area corresponding to the sensing pin BN0 of the capacitive touch device 520 is touched. Therefore, the sensing circuit 920 informs the display controller 910 such that the display controller 910 performs another corresponding operation.

Before detecting the voltage of the input-output pin IOA0 or IOB0, the sensing circuit 920 provides the reference voltage DK to the input-output pin IOA0 or IOB0. Therefore, the sensing operation performed by the sensing circuit 920 is not to be interfered easily by noise.

For brevity, only the input-output pins IOA0 and IOB0 are shown in FIG. 9, but the disclosure is not limited thereto. In other embodiments, the transmission circuit 930 may be coupled to more input-output pins, such as IOA1~IOA3, IOB1~IOB3. The structure of transmission circuit 930 is not limited in the present disclosure. In one embodiment, the transmission circuit 930 comprises switching circuits 931 and 932. The switching circuits 931 and 932 may transmit the corresponding signals according to the switching signal SEL. In other embodiments, the display controller 910 provides two switching signals to control the switching circuits 931 and 932.

In other embodiments, before the sensing circuit 920 performs a sensing operation to detect whether the capacitive touch device 520 is touched, the sensing circuit 920 may send a request signal (not shown) to the display controller 910. The display controller 910 replies to the sensing circuit 920 and sends a grant signal to the sensing circuit 920. In a specific period, the sensing circuit 920 is capable of controlling the voltage levels of the input-output pins IOA0 and IOB0. After the specific period, the voltage levels of the input-output pins IOA0 and IOB0 are controlled by the display device 910.

In a sensing period, the control circuit 900 scans a portion of the input-output pins and set the other portion of the input-output pins to a predetermined level (e.g., a low level or a high level) or a floating level. Therefore, the display device 510 is not interfered with the sensing operation performed by the control circuit 900 in the sensing period.

Additionally, the display device 510 may be a PM display device. Since the reaction speed of the PM display device is slow, even if the potentials of the input-output pins are changed, the PM display device will not respond immediately. Therefore, even if the input-output pins are set to a reference voltage, the display device 510 does not be interfered by the reference voltage. In other embodiments, even if the display device 510 is an AM display device, since the reference voltage is less than the level of the driving signal, the display device 510 does not be interfered by the reference voltage. In some embodiments, the duration of the sensing period is less than the duration of the display period, the display device 510 is not interfered by the sensing operation.

Unless otherwise defined, all terms (including technical and scientific terms) used herein have the same meaning as commonly understood by one of ordinary skill in the art to which this invention belongs. It should be further understood that terms such as those defined in commonly used dictionaries should be interpreted as having a meaning that is consistent with their meaning in the context of the relevant art and will not be interpreted in an idealized or overly formal sense unless expressly so defined herein.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A control circuit comprising:
    a first input-output pin configured to be coupled to a first input pin of a display device and a first sensing pin of a capacitive touch device;
    a second input-output pin configured to be coupled to a second input pin of the display device and a second sensing pin of the capacitive touch device;
    a sensing circuit determining whether the capacitive touch device is touched according to a voltage of the first input-output pin and a voltage of the second input-output pin; and
    a display controller providing a first driving signal to the display device via the first input-output pin and providing a second driving signal to the display device via the second input-output pan in a display period,
    wherein:
    in a first sensing period, the voltage level of the first input-output pin is equal to a first predetermined level, and the sensing circuit detects the voltage of the second input-output pin.

2. The control circuit as claimed in claim 1, wherein the display controller sets the voltage level of the first input-output pin to the first predetermined level in the first sensing period.

3. The control circuit as claimed in claim 1, wherein the sensing circuit sets the voltage level of the first input-output pin to the first predetermined level in the first sensing period.

4. The control circuit as claimed in claim 3, wherein the sensing circuit sets the voltage level of the second input-output pin to a second predetermined level and detects the voltage level of the first input-output pin in a second sensing period.

5. The control circuit as claimed in claim 4, wherein the first predetermined level is opposite to the second predetermined level.

6. The control circuit as claimed in claim 4, wherein each of the first predetermined level and the second predetermined level is a floating level.

7. The control circuit as claimed in claim 1, wherein a duration of the first sensing period is one tenth of a duration of the display period.

8. The control circuit as claimed in claim 1, wherein in the first sensing period, the sensing circuit provides a reference voltage to the second input-output pin and then detects the voltage level of the second input-output pin, and the reference voltage is one-third or one-quarter of a voltage of the first driving signal.

9. The control circuit as claimed in claim 8, wherein the reference voltage is less than 1V.

10. The control circuit as claimed in claim 1, wherein the sensing circuit comprises:
    a comparator comprising a non-inverted input, an inverted input and an output, wherein the non-inverted input is coupled to the first input-output pin;
    a first capacitor coupled between a specific node and the non-inverted input;
    a second capacitor coupled between the specific node and the inverted input; and
    a controller controlling a voltage of the specific node and adjusting a capacitance of the second capacitor according to a voltage of the non-inverted input and a voltage of the inverted input.

11. A display apparatus comprising:
    a display device comprising a first input pin and a second input pin;
    a capacitive touch device comprising a first sensing pin and a second sensing pin; and
    a control circuit comprising:
        a first input-output pin configured to be coupled to the first input pin and the first sensing pin;
        a second input-output pin configured to be coupled to the second input pin and the second sensing pin;
        a sensing circuit determining whether the capacitive touch device is touched according to a voltage of the first input-output pin and a voltage of the second input-output pin; and
        a display controller providing a first driving signal to the display device via the first input-output pin and providing a second driving signal to the display device via the second input-output pin in a display period,
    wherein:
    in a first sensing period, the sensing circuit sets the voltage level of the first input-output pin to a first predetermined level and detects the voltage of the second input-output pin.

12. The display apparatus as claimed in claim 11, wherein the display device is a passive matrix display device.

13. The display apparatus as claimed in claim 11, wherein the display device is a passive matrix organic light-emitting diode display device which comprises a display area to display an image, and the display area comprises a plurality of light-emitting diodes.

14. The display apparatus as claimed in claim 11, wherein the sensing circuit sets the voltage level of the second input-output pin to a second predetermined level and detects the voltage level of the first input-output pin in a second sensing period.

15. The display apparatus as claimed in claim 14, wherein the first predetermined level is opposite to the second predetermined level.

16. The display apparatus as claimed in claim 14, wherein each of the first predetermined level and the second predetermined level is a floating level.

17. The display apparatus as claimed in claim 11, wherein a duration of the first sensing period is one tenth of a duration of the display period.

18. The display apparatus as claimed in claim 11, wherein in the first sensing period, the sensing circuit provides a reference voltage to the second input-output pin and then detects the voltage level of the second input-output pin, and the reference voltage is one-third or one-quarter of a voltage of the first driving signal.

19. The display apparatus as claimed in claim 18, wherein the reference voltage is less than 1V.

20. The display apparatus as claimed in claim 11, wherein the sensing circuit comprises:
- a comparator comprising a non-inverted input, an inverted input and an output, wherein the non-inverted input is coupled to the first input-output pin;
- a first capacitor coupled between a specific node and the non-inverted input;
- a second capacitor coupled between the specific node and the inverted input; and
- a controller controlling a voltage of the specific node and adjusting a capacitance of the second capacitor according to a voltage of the non-inverted input and a voltage of the inverted input.

* * * * *